United States Patent [19]
Sugiura et al.

[11] Patent Number: 5,932,896
[45] Date of Patent: Aug. 3, 1999

[54] NITRIDE SYSTEM SEMICONDUCTOR DEVICE WITH OXYGEN

[75] Inventors: Lisa Sugiura, Kawasaki; Mariko Suzuki; Kazuhiko Itaya, both of Yokohama; Hidetoshi Fujimoto; Johji Nishio, both of Kawasaki; John Rennie, Tokyo; Hideto Sugawara, Kawasaki, all of Japan

[73] Assignee: Kabushiki Kaisha Toshiba, Kawasaki-shi, Japan

[21] Appl. No.: 08/924,834

[22] Filed: Sep. 5, 1997

[30] Foreign Application Priority Data

Sep. 6, 1996 [JP] Japan .................................. 8-236744
Feb. 21, 1997 [JP] Japan .................................. 9-037990

[51] Int. Cl.⁶ .................................................. H01L 33/00
[52] U.S. Cl. .......................... 257/94; 257/96; 257/97; 257/102; 257/103; 372/43; 372/44; 372/45
[58] Field of Search .................... 257/94, 96, 97, 257/103, 102; 372/43, 44, 45

[56] References Cited

U.S. PATENT DOCUMENTS 5,617,438  4/1997  Hatano et al. ............................ 372/45

FOREIGN PATENT DOCUMENTS 8-148718  6/1996  Japan .

*Primary Examiner*—William Mintel
*Attorney, Agent, or Firm*—Oblon, Spivak, McClelland, Maier & Neustadt, P.C.

[57] ABSTRACT

The present invention provides a nitride system semiconductor device which decreases cost and improves productivity without heat treatment after the growth and which increases in lifetime and reliability by enhancing the quality of a p-type conductive layer, and a method for manufacturing the nitride system semiconductor device. The nitride system semiconductor device has a multilayer structure of an n-type $In_xGa_yAl_zB_{1-x-y-z}N_mP_nAs_{1-m-n}$ ($0 \leq x$, $0 \leq y$, $0 \leq z$, $0 \leq x+y+z \leq 1$, $0 < m$, $0 \leq n$, $0 < m+n \leq 1$) layer, a p-type $In_xGa_yAl_zB_{1-x-y-z}N_mP_nAs_{1-m-n}$ ($0 \leq x$, $0 \leq y$, $0 \leq z$, $0 \leq x+y+z \leq 1$, $0 < m$, $0 \leq n$, $0 < m+n \leq 1$) layer, and an electrode 22 formed on a substrate. The oxygen concentration of the surface of the p-type $In_xGa_yAl_zB_{1-x-y-z}N_mP_nAs_{1-m-n}$ layer is $5 \times 10^{18}$ cm⁻³ or lower.

16 Claims, 22 Drawing Sheets

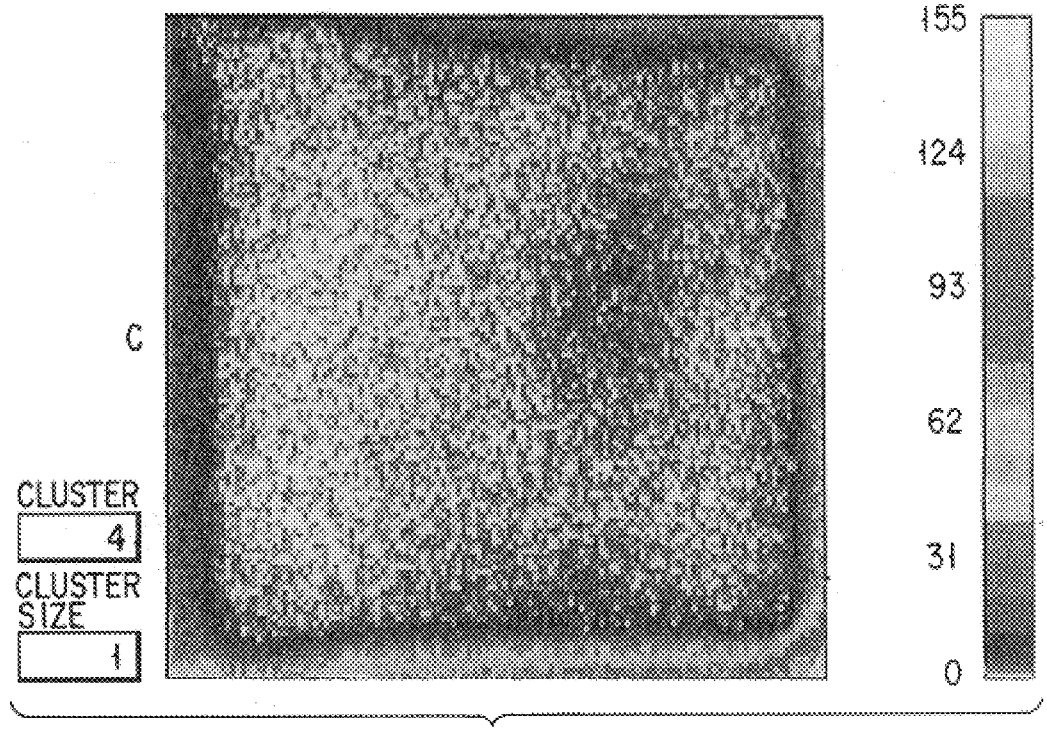
F I G. 5
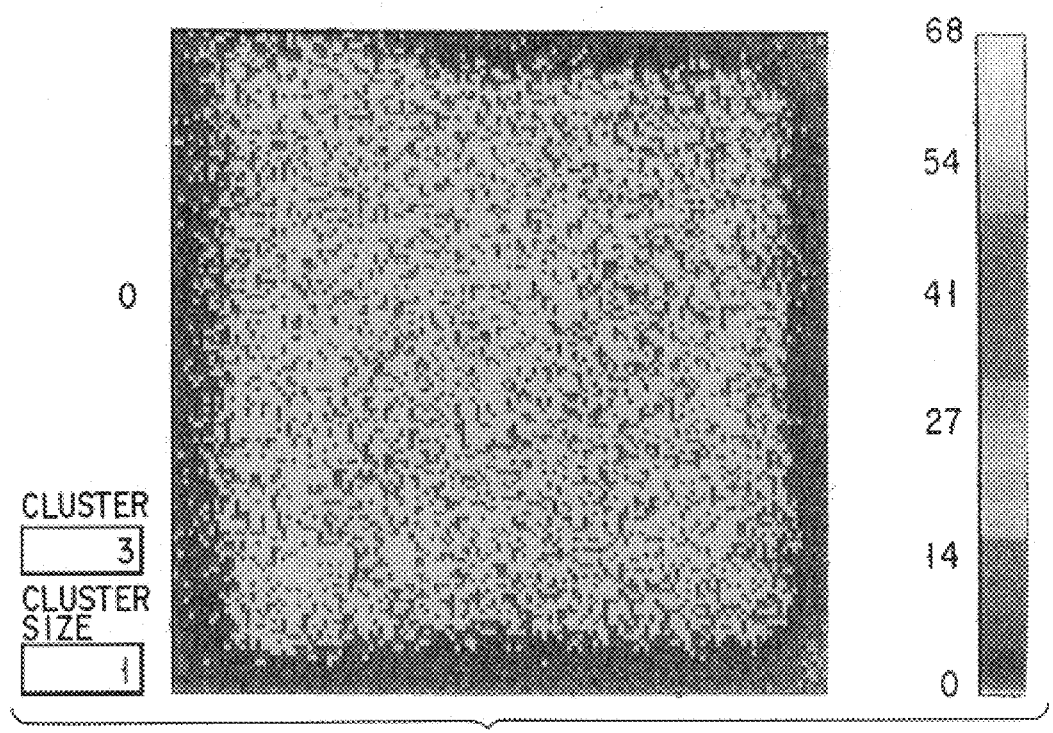
F I G. 6

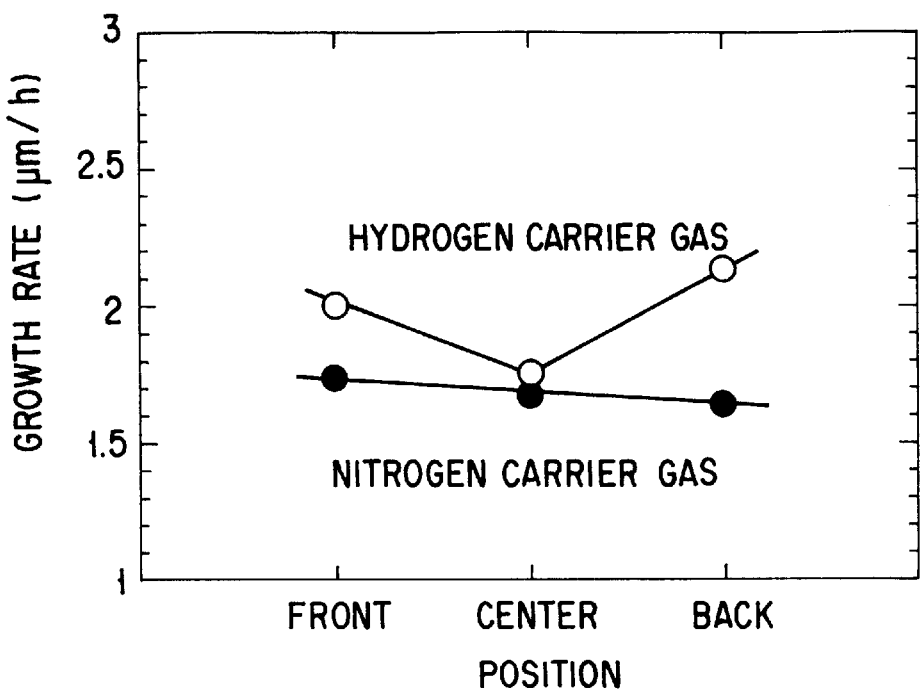
F I G. 13
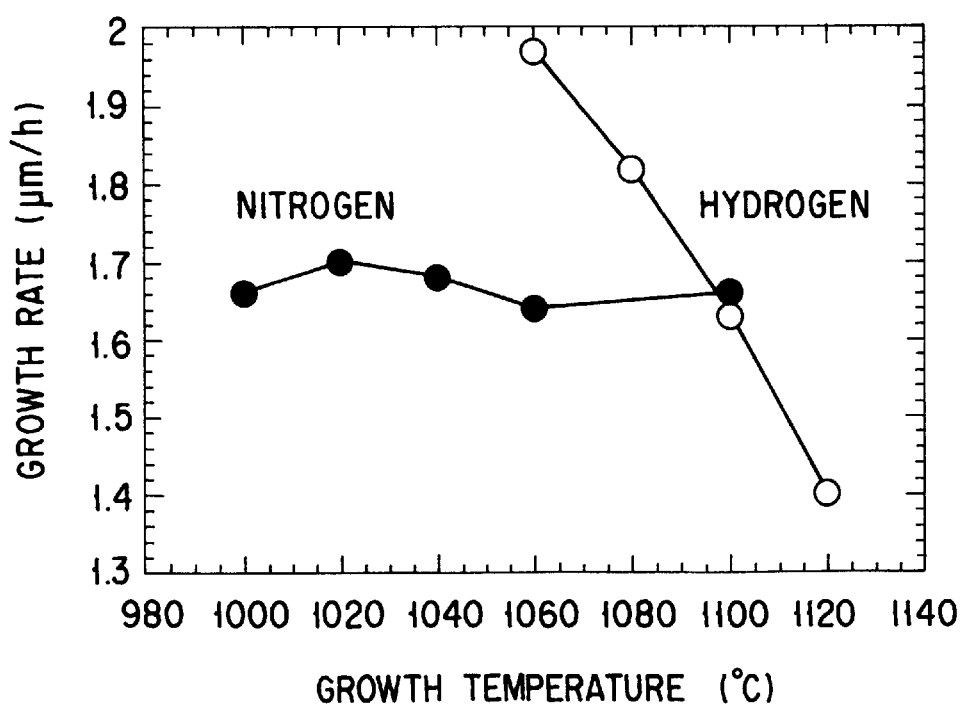
F I G. 14

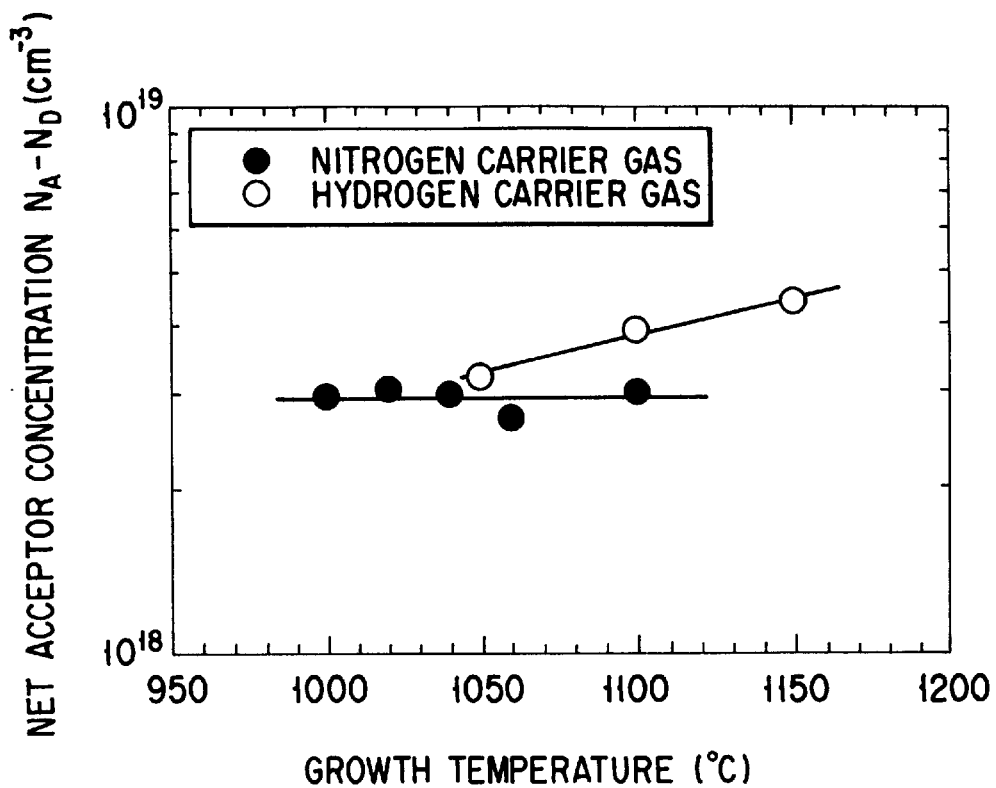
F I G. 15
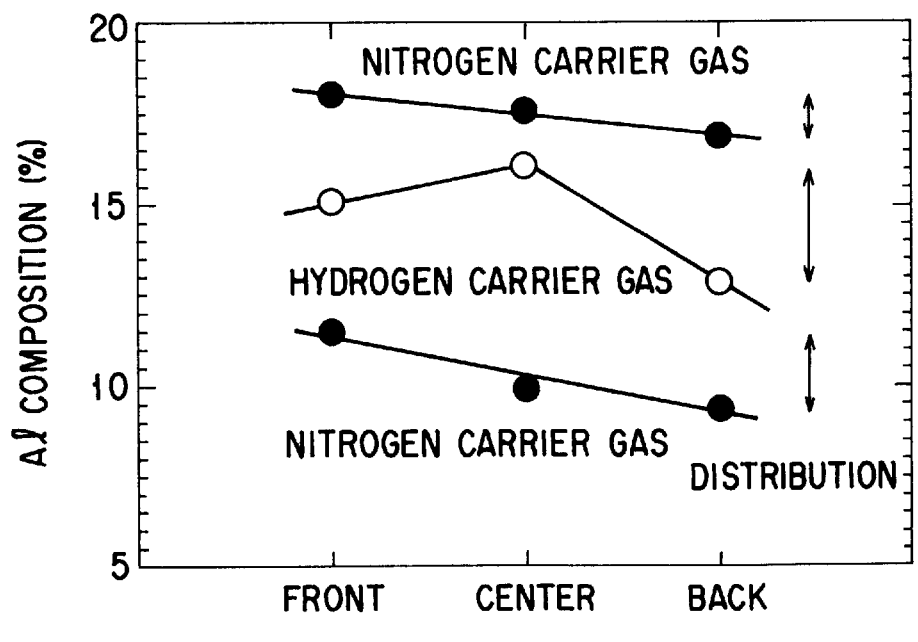
F I G. 16

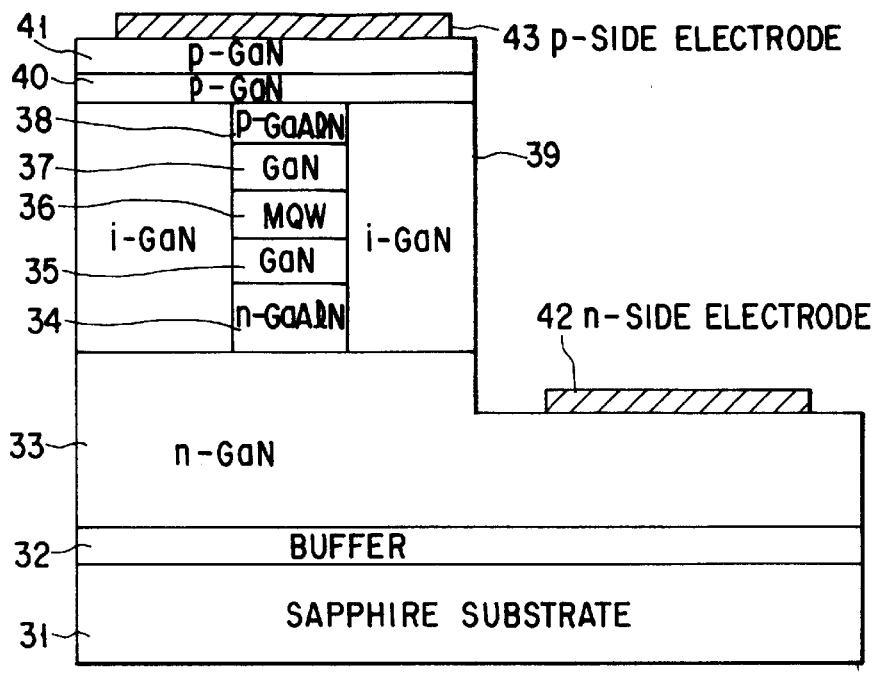
FIG. 17
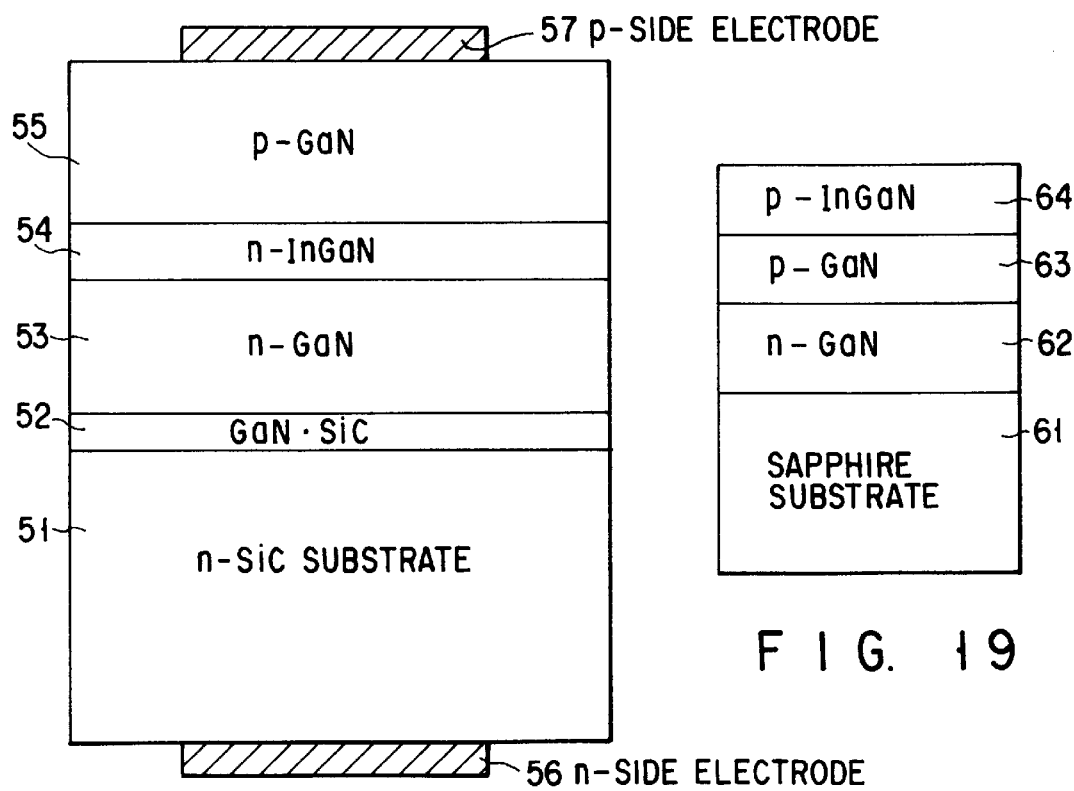
FIG. 18
FIG. 19

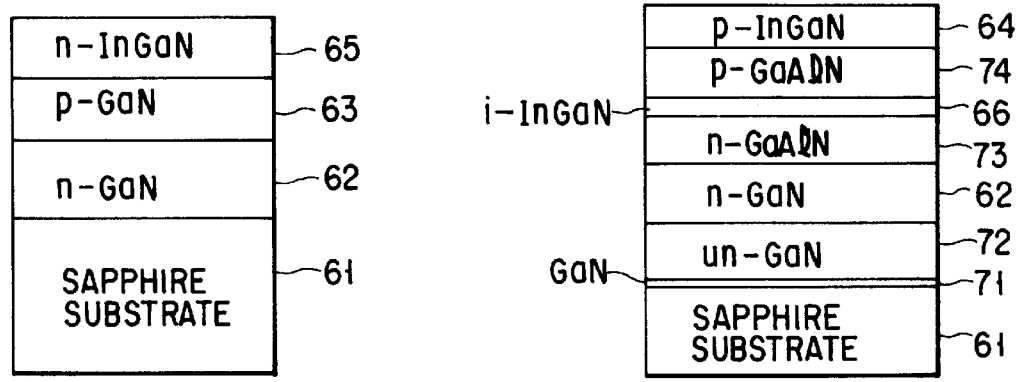
FIG. 21
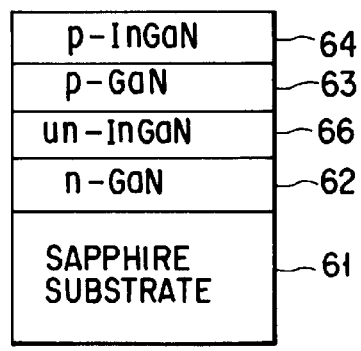
FIG. 22
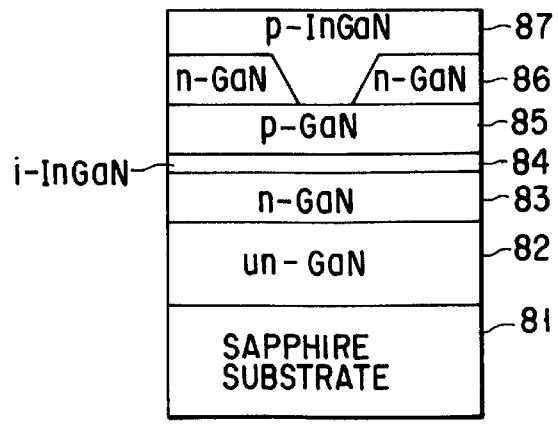
FIG. 24
FIG. 23
FIG. 25

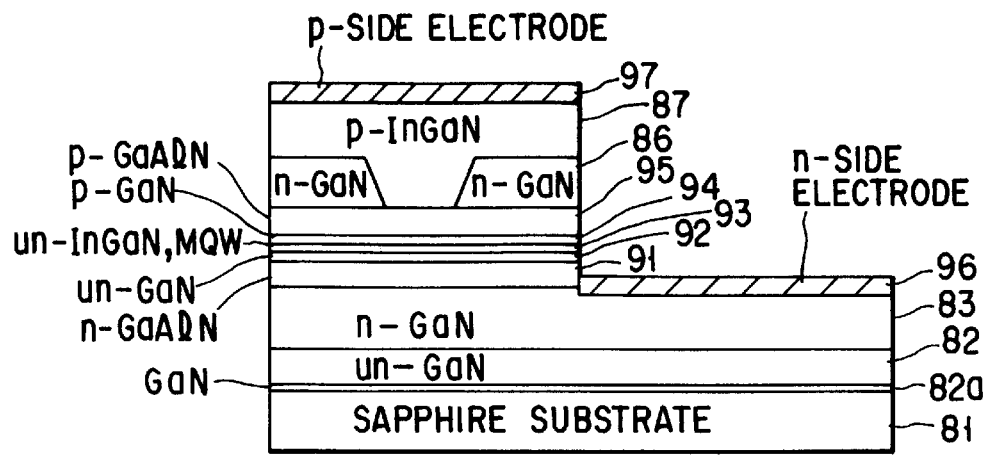
F I G. 31
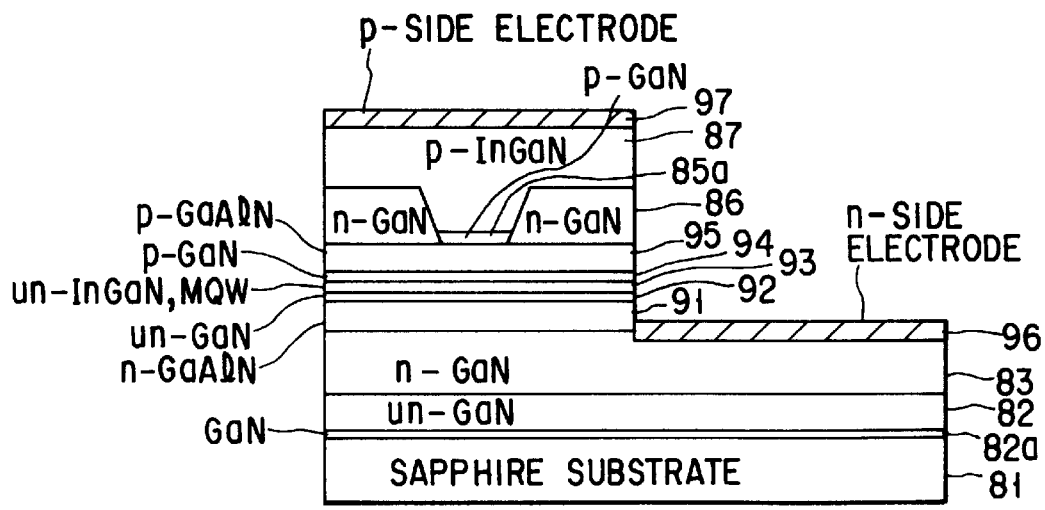
F I G. 32
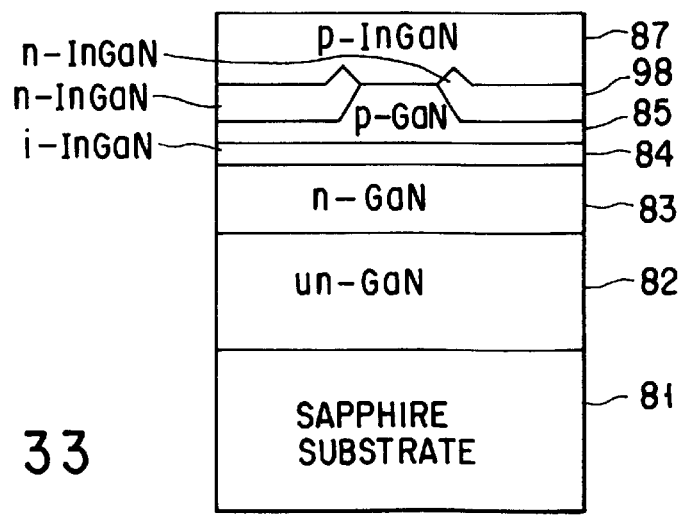
F I G. 33

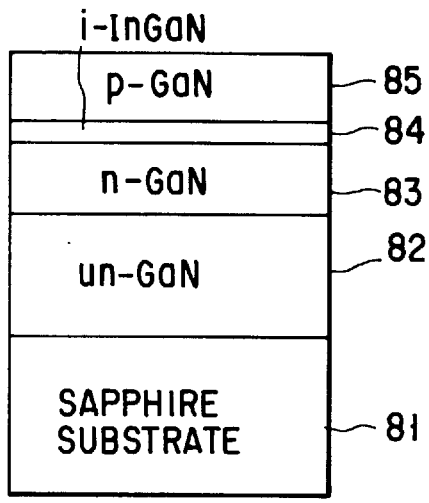
F I G. 34A
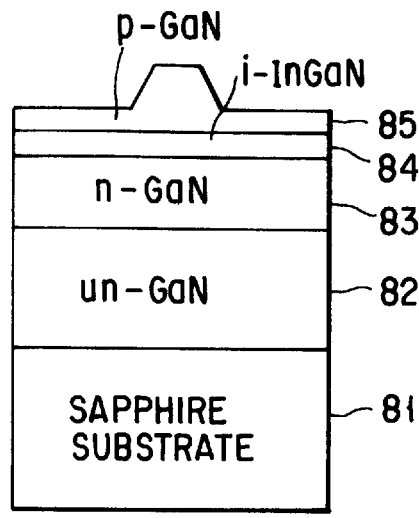
F I G. 34B
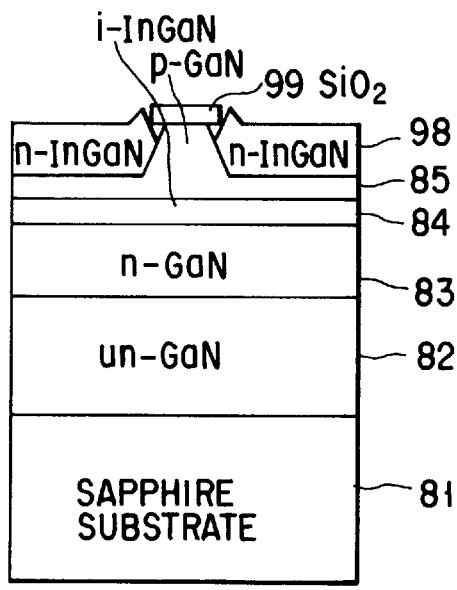
F I G. 34C
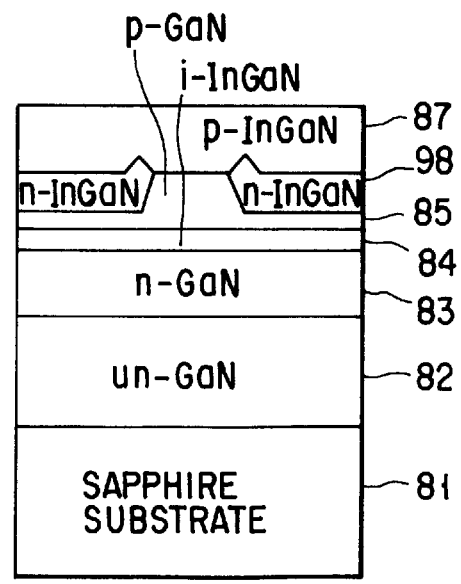
F I G. 34D

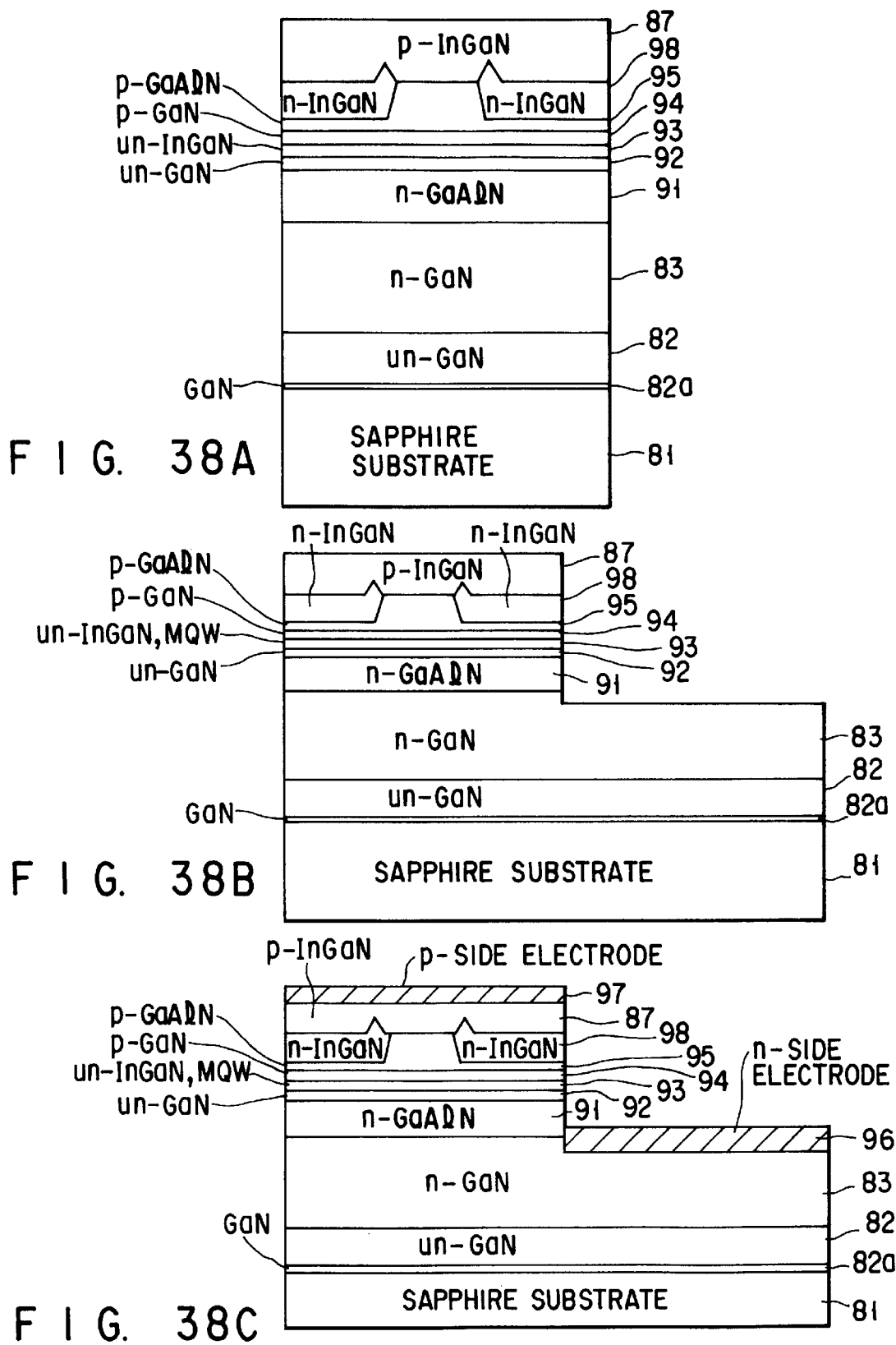

NITRIDE SYSTEM SEMICONDUCTOR DEVICE WITH OXYGEN

BACKGROUND OF THE INVENTION

The present invention relates to a nitride system semiconductor device usable for a semiconductor laser and a light emitting diode and a method for manufacturing the same and, more particularly, to a low-resistance nitride system semiconductor device having good ohmic contact with an electrode and operated at a low voltage and a method for manufacturing the same.

A nitride system semiconductor such as GaAlN, from GaN down, has recently been noticed as materials for a light emitting diode (hereinafter referred to as LED) and a semiconductor laser diode (hereinafter referred to as LD) in a short wavelength region from blue to ultraviolet. In particular, the InGaAlN system mixed crystal has the maximum transition type energy gap in the III-V family compound semiconductor mixed crystal, and is known as light emitting materials in a wavelength of 0.2 $\mu$m to 0.6 $\mu$m or in a region from red to violet.

A semiconductor light emitting device using the above nitride system semiconductor materials necessitates a p-type conductive layer and an n-type conductive layer, constituted of a nitride type semiconductor layer as a current injection layer and a contact layer contacting an electrode.

In manufacturing a current injection type light emitting device, it is essential to control the conductivity type, conductivity (impurity concentration, carrier concentration), etc. of each of the p- and n-type conductive layers since the element is based on a pn junction type. In InGaAlN system materials, the conductivity type of the n-type conductive layer can be relatively easily controlled by using silicon (Si) as impurities.

On the other hand, it is difficult to control the conductivity type, conductivity (accepter concentration, carrier concentration), etc. of the p-type conductive layer. As one method of forming the p-type conductive layer, magnesium (Mg) or zinc (Zn) is usually employed as dopant, a growth substrate held at a high temperature of about 1100° C. is placed in hydrogen carrier gas ($H_2$) and ammonia gas ($NH_3$), and Ga and Al raw materials are supplied onto the growth substrate.

However, an Mg-doped nitride system semiconductor layer such as an Mg-doped GaN layer and an GaAlN layer, which is formed by the above method, exhibits high resistance, not p-type conductivity.

It is thought that acceptors of Mg and Zn are prevented from being activated by deep level of impurities of Zn and Mg and by active hydrogen atoms, which are dissolved from ammonia ($NH_3$) as material gas and hydrogen as carrier gas, or the other residual impurities particularly in the MOCVD (Metalorganic Chemical Vapor Deposition)(J. A. Van Vechten et al., Jpn. J. Appl. Phys. 31, 1992, 3662).

If the Mg-doped InGaAlN layer is grown by the MOCVD, hydrogen is taken into crystal from ammonia (NH3) and carrier gas, together with magnesium (Mg), before the temperature of the substrate is decreased to the room temperature during or after the growth of an Mg-doped layer, and Mg acceptors will be inactivated by H+, thus increasing the resistance of the Mg-doped InGaAlN layer. If, for example, a GaN layer is doped with Mg at a concentration of $1 \times 10^{20}$ $cm^{-3}$, the concentration of hydrogen is also taken into the GaN layer by $1 \times 10^{20}$ $cm^{-3}$ which is same degree as that of Mg. The hydrogen concentration of the Mg-doped GaN layer is ten or more times as high as that an undoped or Si-doped GaN layer grown under the same conditions, and it was confirmed by Hall measurement, C-V measurement or the like that the grown Mg-doped GaN layer was increased in resistance.

The Mg-doped GaN layer, which is grown and increased in resistance, is subjected to electron irradiation (H. Amano et al., Jpn. J. Appl. Phys. 28, 1989, L2112) or heat treatment (S. Nakamura et al., Jpn. J. Appl. Phys. 31, 1992, 1258) to thereby to improve the activation of Mg and achieve a practical high-luminosity device and LD emission (S. Nakamura et al., Jpn. J. Appl. Phys. 35, 1996, L74).

In general, the Mg-doped nitride system semiconductor layer undergoes post-treatment such as heat treatment for removing hydrogen in an atmosphere of gaseous nitrogen of 600° C. to 800° C.

After the heat treatment, the Mg-doped nitride system semiconductor layer exhibits a p-type conductivity type but causes a high-resistance layer on the uppermost surface of a growing layer. The reason why this high-resistance layer is caused, will now be described in detail.

FIG. 1 is a schematic view showing the structure of a typical blue semiconductor laser using a nitride system semiconductor. The blue semiconductor laser has a multilayer structure in which a buffer layer (not shown), a GaN underlying layer 2, a GaN contact layer 3, an n-type GaAlN current injection layer 4, an active layer 5 having a multiple quantum well (MQW) structure using InGaN, a p-type GaAlN current injection layer 6, and a p-type GaN contact layer 7 for forming a p-type electrode are formed in sequence on a sapphire substrate 1 by the MOCVD.

When the multilayer structure blue semiconductor laser is formed, hydrogen is used as carrier gas for all the layers except the InGaN system active layer 5. On the other hand, nitrogen is employed as carrier gas in forming the InGaN active layer 5. When the p-type GaAlN current injection layer 6 and p-type GaN contact layer 7 are formed, Mg is used as p-type dopant. Since Mg is not activated during the growth, the multilayer structure is subjected to heat treatment in the nitrogen atmosphere.

After the heat treatment, part of the multilayer structure is removed to such a depth as to reach the GaN contact layer 3 by dry etching and then an n-side electrode 8 is formed on the GaN contact layer 3. A p-side electrode 9 is formed on the unremoved part of the p-type GaN contact layer 7. Thus, the sample including these electrodes 8 and 9 is cleaved to form facets for the laser cavities, resulting in a blue semiconductor laser.

Since, however, the blue semiconductor laser has a high-resistance portion on the uppermost surface of the contact layer 7, its operation voltage is high, thus making it difficult to inject current necessary for laser emission into the device. If the current is to be injected, then the operation voltage will increase to 20V or higher and the vicinity of the p-side electrode 9 will be broken. To resolve this problem, the contact resistance of the p-side electrode 9 has to be lowered.

In the blue semiconductor laser, the distribution of concentrations of magnesium (Mg), carbon (C), hydrogen (H) and oxygen (0) in the depth direction of the sample before and after the heat treatment in the nitrogen atmosphere, was obtained by secondary ion mass spectrometry (hereinafter referred to as SIMS). As a result, as shown in FIG. 2, the concentration of Mg is fixed in the depth direction of the sample both before and after the heat treatment. On the other hand, the distribution of concentrations of carbon (C), hydrogen (H) and oxygen (O) is virtually constant before the heat treatment, whereas, after the heat treatment, a larger amount of carbon (C), hydrogen (H) and oxygen (O) is detected on the uppermost surface of the growing layer of the sample than that inside the growing layer. For example, the carbon and hydrogen are each sometimes detected on the uppermost surface of the growing layer more than that inside the growing layer by one to two figures.

The causes of increasing in resistance of contact between the p-type GaN contact layer 7 and p-side electrode 9 and thus heightening the device voltage, are as follows. Hydrogen diffuses from inside the growing layer onto the surface thereof by heat treatment, and a large amount of hydrogen remains on the uppermost surface thereof, with the result that the hydrogen is combined with magnesium and the magnesium is inactivated. There is a large amount of carbon on the uppermost surface of the growing layer due to contaminant caused when the carbon is diffused from inside the growing layer or the heat treatment is carried out, while there is a large amount of oxygen due to a surface oxide film caused by heat treatment or its diffusion from inside the growing layer.

If there is a large amount of oxygen or carbon on the uppermost surface of the growing layer, the following three problems (1) to (3) will arise.

(1) The activation rate of dopant such as Mg is decreased, as is the density of carriers, and (2) no good ohmic contact with the electrode can be achieved. These problems (1) and (2) decrease the reliability of the device, i.e., they increase the resistance of contact with the p-side electrode 9, increase the operation voltage of the device, shortening the lifetime of the device, etc. Furthermore, (3) the impurities are diffused by crystal defects such as a dislocation and a stacking fault, and the leak current will be increased.

The nitride system semiconductor device described above necessitates heat treatment; however, the time required for sufficiently activating magnesium in the growing layer is varied with a difference in device structure such as the thickness of the p-type layer and the composition of each layer. Though the heat treatment time can be estimated to some extent taking into consideration the diffusion of hydrogen, it is not easy to determine the optimum heat treatment time at a heat treatment temperature.

In other words, though the nitride system semiconductor device requires the heat treatment, the heat treatment temperature and time the most suitable for dissociating hydrogen are indefinite, the hydrogen remains in the p-type conductive layers 6 and 7, or an excessive heat treatment, and there are strong possibility that the activation rate of magnesium is decreased. The hydrogen remaining in the layers 6 and 7 causes the resistance of the entire device to increase and, like the contact resistance, it causes the operation voltage of the device to rise.

In order to solve the above problem, a trial to form an equivalent for the p-type conductive layers 6 and 7 without any heat treatment, is disclosed in Jpn. Pat. Appl. KOKAI Publication No. 8-125222. According to this publication, the p-type conductive layers are obtained by replacing an atmospheric gas with inactive gas other than gaseous hydrogen and gaseous ammonia in the process of decreasing the temperature after the growth. This method requires no heat treatment process; however, as described above, a high-resistance layer is formed in the growing layer due to the residual hydrogen or the like, so that it is not thought that good ohmic contact can be obtained or the device characteristics is improved. Furthermore, the publication teaches an Mg-doped layer grown in the nitrogen atmosphere, and the Mg-doped layer is an insulator whose resistance is $10^8$ Ωcm or higher.

The above-described nitride system semiconductor device and its manufacturing method necessitate a specific operation such as heat treatment and electron irradiation after the growth in order to activate magnesium. Therefore, they have problems of decreasing in yield and deteriorating in quality of crystal due to the increase in manufacturing step as well as problems of consuming much time, decreasing in productivity, and increasing in costs.

Furthermore, there is a problem in which since a large amount of hydrogen, carbon and oxygen is present on the surface of the growing layer due to the heat treatment after the growth, the contact resistance of the p-type GaN contact layer 7 rises and the operation voltage of the device increases. There is also a problem in which the device is decreased in reliability since the lifetime of the LED does not reach a practical level due to deterioration of the vicinity of the p-side electrode 9.

The LD has a problem wherein if the resistance of contact with the p-side electrode 9 is high, a laser beam is difficult to emit and, like the LED, it has a problem of remarkably shortening the lifetime due to deterioration of the p-side electrode 9.

BRIEF SUMMARY OF THE INVENTION

The present invention has been developed in consideration of the above situation and its object is to provide a nitride system semiconductor device which decreases in cost and improves in productivity without any specific operation such as heat treatment and electron irradiation after the growth and which improves in reliability by increasing the quality of a p-type conductive layer and lengthening the lifetime of the device, and a method for manufacturing the nitride system semiconductor device.

It is another object of the present invention to provide a nitride system semiconductor device which allows the conductivity type of a p-type conductive layer to be easily controlled, has a good, low-resistance ohmic contact, and operates at a low operation voltage, and a method for manufacturing the same.

The first gist of the present invention is that in a nitride system compound semiconductor device constituted of GaN or the like, in the process of forming a semiconductor layer serving as a p-type layer and decreasing the temperature after the layer is formed, nitrogen is employed as the carrier gas to prevent a compound of magnesium and hydrogen from being formed, allow the magnesium to easily enter a site for Ga, and thus activate the magnesium without heat treatment.

At the beginning of the development a few methods of using nitrogen gas were proposed. Since nitride system compound semiconductor devices were too difficult to form layers with high quality and achieve p-type conductivity, the use of the nitrogen as the main carrier gas is habitually avoided at present. For this reason, an instance report for using nitrogen as the main carrier gas in the process of forming a p-type layer is not found. However, the inventors of the present invention have keenly studied and experimented and found that a nitride system compound semiconductor layer can be grown in the nitrogen gas by using high-purified nitrogen gas and optimizing the respective growing conditions. The present invention aims at taking various advantages using the growth technique in the nitrogen gas and based on the growing mechanism of a p-type layer in the nitrogen atmosphere.

The second gist of the present invention lies in that hydrogen, carbon, oxygen or the like is prevented from being nonuniformly present on the uppermost surface of the growing layer by excluding the heat treatment, thereby preventing inactivation of magnesium due to hydrogen and doing high resistance of the surface due to carbon and oxygen.

In addition, the high resistance of the surface is limited not only to the case where the amount of oxygen or carbon on the uppermost surface of the growing layer is large, but also to the case where the amount is too small ($1 \times 10^{16}$ cm$^{-3}$ or less). The reason is as follows. When the amount of oxygen or carbon on the uppermost surface of the growing layer is $1 \times 10^{16}$ cm$^{-3}$ or less, the effect of filling the nitrogen vacancy due to oxygen or carbon is decreased, the nitrogen vacancy compensates for the acceptors, and the device increases in resistance.

Therefore, according to the present invention, the concentrations of oxygen and carbon on the uppermost surface of the growing layer are each controlled to fall within an appropriate range with a view of achieving good, low-resistance ohmic contact. The range is given as follows even after an ohmic contact electrode is formed.

$1 \times 10^{16} <$ oxygen concentration $\leq 5 \times 10^{18}$ (cm$^{-3}$)

$1 \times 10^{16} <$ carbon concentration $\leq 5 \times 10^{19}$ (cm$^{-3}$)

In order to obtain better, lower-resistance ohmic contact, the oxygen concentration is favorably set to $1 \times 10^{18}$ cm$^{-3}$ or lower and, more favorably, it is set to $5 \times 10^{17}$ cm$^{-3}$ or lower. By controlling the oxygen and carbon concentrations, the conventional contact resistance of about $10^{-1}$ $\Omega$cm$^2$ is reduced to $10^{-3}$ $\Omega$cm$^2$ or lower.

The third gist of the present invention is that the device contains hydrogen as carrier gas in addition to main carrier gas. In other words, since the organometallic materials (Cp$_2$Mg, TMG, TMA, etc.) of Mg, Ga and Al are easily dissolved by hydrogen, if hydrogen gas is employed as the carrier gas, magnesium is easy to be included in the semiconductor layer. Further, since using some little hydrogen carrier gas in addition to main carrier gas, semiconductor layer can be grown with lower temperature, in addition, there are effects of improvement of increase of growth rate and flatness of the surface of the growth layer.

The fourth gist of the present invention lies in that a nitride system semiconductor device having a multilayer structure of GaN system semiconductors constituted of In$_x$Ga$_y$Al$_{1-x-y}$N ($0 \leq x$, $x+y \leq 1$), favorably includes a double-heterostructure wherein an active layer is interposed between an n-type semiconductor layer and a p-type semiconductor layer and a process of causing a layer containing indium ($0 < x \leq 0.3$) to grow on at least an upper layer of a p-type semiconductor layer.

In other words, when the p-type semiconductor layer containing indium is formed in substantially the nitrogen atmosphere, it has the advantage of easily being controlled since the range of growth conditions for forming a mirror face is broader than that for forming a p-type Ga$_q$Al$_{1-q}$N layer.

The semiconductor layer containing indium (In$_x$Ga$_y$Al$_{1-x-y}$N, $0 < x$, $0 \leq y$, $0 < x+y \leq 1$) can be either of p and n types. Furthermore, the semiconductor layer is not limited to In$_x$Ga$_y$Al$_{1-x-y}$N, but can include boron (B) as a III-family element and does phosphorus (P) and/or arsenic (As), i.e., In$_x$Ga$_y$Al$_z$B$_{1-x-y-z}$N$_m$P$_n$As$_{1-m-n}$ ($0 < x$, $0 \leq y$, $0 \leq z$, $0 < x+y+z \leq 1$, $0 < m$, $0 \leq n$, $0 < m+n \leq 1$).

The p-type semiconductor layer can be formed as a p-type GaN system semiconductor layer including acceptor impurities such as Mg and Zn. A combination of the p-type GaN system semiconductor layer and the semiconductor layer containing indium formed thereon is suitable for the inner stripe (hereinafter referred to as IS) structure shown in FIG. 27 or the selectively buried ridge waveguide (hereinafter referred to as SBR) structure illustrated in FIG. 33.

The fifth gist of the present invention lies in a desirable method of manufacturing a current blocking structure as shown in FIGS. 26A to 26C. It is preferable that the current blocking structure be obtained by the following process. An n-type GaN guide layer 83, an undoped GaN active layer 84, a p-type GaN guide layer 85, and an n-type GaN current blocking layer 86 are formed in sequence on a sapphire substrate 81 in the same chamber by the first MOCVD. After that, part of the n-type GaN current blocking layer 86 is removed by etching and then a p-type InGaN contact layer 87 is formed by the second MOCVD (regrowth).

It is desirable to cause the layers to grow by the MOCVD using Mg or Zn as p-type dopant. According to the manufacturing method, the InGaN semiconductor layer 87 formed by the second MOCVD becomes a p-type low-resistance layer without heat treatment, as does an interface between the p-type GaN semiconductor layer 85 and the layer 87. However, an interface between the layer 85 and the n-type GaN current blocking layer 86 does not become a p-type low resistance. As a result, the method of forming the InGaN contact layer 87 by the second MOCVD, produces the effect of promoting the current blocking as well as the foregoing effect of achieving a p-type low resistance without heat treatment.

The sixth gist of the present invention lies in a desirable method of manufacturing a SBR structure as illustrated in FIGS. 34A to 34D. It is preferable that the SBR structure be obtained by the following process. An n-type GaN semiconductor layer 83, an undoped InGaN semiconductor layer 84, and a p-type GaN semiconductor layer 85 are formed in order on a sapphire substrate 81 in the same chamber by the first MOCVD. After that, the p-type GaN semiconductor layer 85 is partly removed by etching to form a ridge. An n-type InGaN semiconductor layer 98 is caused to selectively grow by the second MOCVD (second growth) using a mask 99 of, e.g., SiO$_2$. Then, the mask 99 is eliminated and the p-type InGaN semiconductor layer 87 is formed by the third MOCVD.

The following are specific means for attaining the objects of the present invention based on the above-described gist of the present invention:

The present invention is directed to a nitride system semiconductor device, comprising:

a substrate;

a plurality of nitride system semiconductor layers stacked up on the substrate;

a p-type In$_x$Ga$_y$Al$_z$B$_{1-x-y-z}$N$_m$P$_n$As$_{1-m-n}$ ($0 \leq x$, $0 \leq y$, $0 \leq z$, $0 \leq x+y+z < 1$, $0 < m$, $0 \leq n$, $0 < m+n \leq 1$) layer included in the plurality of nitride system semiconductor layers and formed as an uppermost layer;

a p-side electrode formed on one surface of the p-type In$_x$Ga$_y$Al$_z$B$_{1-x-y-z}$N$_m$P$_n$As$_{1-m-n}$ layer;

an n-type In$_x$Ga$_y$Al$_z$B$_{1-x-y-z}$N$_m$P$_n$As$_{1-m-n}$ ($0 < x$, $0 \leq y$, $0z$, $0 \leq x+y+z \leq 1$, $0 < m$, $0 \leq n$, $0 < m+n \leq 1$) layer included in the plurality of nitride system semiconductor layers and formed closer to the substrate than the p-type In$_x$Ga$_y$Al$_z$B$_{1-x-y-z}$N$_m$P$_n$As$_{1-m-n}$ layer; and an n-side electrode provided on at least one of the substrate and one of the plurality of nitride system semiconductor layers so as to form a current path extending from the p-side electrode through the p-type $In_xGa_yAl_zB_{1-x-y-z}N_mP_nAs_{1-m-n}$ layer and the n-type $In_xGa_yAl_zB_{1-x-y-z}N_mP_nAs_{1-m-n}$ layer.

The nitride system semiconductor device is characterized in that the concentration of oxygen in close vicinity to the surface of the p-type $In_xGa_yAl_zB_{1-x-y-z}N_mP_nAs_{1-m-n}$ layer is $5 \times 10^{18}$ cm$^{-3}$ or lower.

A nitride system semiconductor device, which prevents high resistance of the surface due to oxygen, easily controls the conductivity type of the p-type conductive layer, has good, low-resistance ohmic contact, and operates at a low operation voltage, can thus be achieved.

The concentration of oxygen is substantially uniform from a depth of 200 nm or more from the uppermost layer toward the substrate. The "substantially uniform" means variations within a range of one figure or less, such as a region of the concentration of $1 \times 10^{18}$ cm$^{-3}$ or less and, in other words, the resistance in the device can considerably be decreased.

The nitride system semiconductor device is characterized in that the maximum concentration of oxygen in close vicinity to the surface of the p-type $In_xGa_yAl_zB_{1-x-y-z}N_mP_nAs_{1-m-n}$ layer is 5 or less times as high as the average of oxygen concentration within the surface thereof. Favorably it is 3 or less times, and more favorably it is 2 or less times.

Since, therefore, a region of high oxygen concentration is not present locally within the wafer plane, the problems of nonuniform current injection, generation of a non-emitting region, adverse influence upon a guided wave, resistance, electromigration, deformation, and thermal characteristics, can be eliminated, thereby improving in reliability further.

Similarly, the nitride system semiconductor device is characterized in that the concentration of carbon in close vicinity to the surface of the p-type $In_xGa_yAl_zB_{1-x-y-z}N_mP_nAs_{1-m-n}$ layer is $5 \times 10^{19}$ cm$^{-3}$ or lower. Therefore, as described above, the device has good, low-resistance ohmic contact and operates at a low operation voltage while preventing a high resistance of the surface due to carbon and easily controlling the conductivity type of the p-type conductive layer.

The concentration of carbon is substantially uniform from a depth of 200 nm or more from the uppermost layer toward the substrate. The meaning of "substantially uniform" has been described above. In this case, too, the resistance in the device can considerably be decreased.

The nitride system semiconductor device is characterized in that the maximum concentration of carbon in close vicinity to the surface of the p-type $In_xGa_yAl_zB_{1-x-y-z}N_mP_nAs_{1-m-n}$ layer is 5 or less times as high as the average of carbon concentration within the surface thereof. Favorably it is 3 or less times, and more favorably it is 2 or less times. Since, therefore, a region of high carbon concentration is not present locally within the wafer plane, an adverse influence such as nonuniform current injection and generation of a non-emitting region can be eliminated, thereby improving in reliability further.

The nitride system semiconductor device as described above may further comprises:

an active layer constituted of a nitride system semiconductor and formed in contact with another surface of the p-type $In_xGa_yAl_zB_{1-x-y-z}N_mP_nAs_{1-m-n}$ ($0 \leq x$, $0 \leq y$, $0 \leq z$, $0 \leq x+y+z \leq 1$, $0<m$, $0 \leq n$, $0<m+n \leq 1$) layer which is opposite to the one surface on which the p-side electrode is formed;

an n-type semiconductor layer of a nitride system, formed in contact with one surface of the active layer which is opposite to another surface on which the p-type $In_xGa_yAl_zB_{1-x-y-z}N_mP_nAs_{1-m-n}$ layer; and a double hetero structure including the p-type $In_xGa_yAl_zB_{1-x-y-z}N_mP_nAs_{1-m-n}$ layer, the active layer, and the n-type semiconductor layer.

The p-type $In_xGa_yAl_zB_{1-x-y-z}N_mP_nAs_{1-m-n}$ layer includes at least two layers, and a p-type $In_xGa_yAl_zB_{1-x-y-z}N_mP_nAs_{1-m-n}$ ($0<x \leq 0.3$, $0 \leq y$, $0 \leq z$, $0<x+y+z \leq 1$, $0<m$, $0 \leq n$, $0<m+n \leq 1$) layer can be used as an uppermost layer of the two layers.

Since, therefore, the structure of the device is optimized and the ingredient ratio of indium (In) is defined within an adequate range, the aforementioned function of low resistance can easily and reliably be carried out.

The p-type $In_xGa_yAl_zB_{1-x-y-z}N_mP_nAs_{1-m-n}$ ($0 \leq x$, $0 \leq y$, $0 \leq z$, $0 \leq x+y+z \leq 1$, $0<m$, $0 \leq n$, $0<m+n \leq 1$) layer includes at least two layers, and each of the layers can contain one of magnesium and zinc as an impurity element.

Since, therefore, a dopant element is defined, the function of controlling the p-type conductivity can easily and reliably be carried out.

The nitride system semiconductor device can further comprise a p-type $In_sGa_qAl_rB_{1-s-q-r}N_mP_nAs_{1-m-n}$ ($0 \leq s<0.3$, $s<x$, $0 \leq q$, $0 \leq r$, $0 \leq s+q+r \leq 1$, $0<m$, $0 \leq n$, $0<m+n \leq 1$) layer formed between the p-type $In_xGa_yAl_zB_{1-x-y-z}N_mP_nAs_{1-m-n}$ of the uppermost layer and the p-type $In_xGa_yAl_zB_{1-x-y-z}N_mP_nAs_{1-m-n}$ layer of active-layer-side.

Since the indium ingredient ratio (s) of a layer formed directly under the uppermost layer is lower than that (x) of the uppermost layer, the lattice matching as well as the function of low resistance can easily be obtained.

The thickness of the p-type $In_xGa_yAl_zB_{1-x-y-z}N_mP_nAs_{1-m-n}$ ($0<x \leq 0.3$, $0 \leq y$, $0 \leq z$, $0<x+y+z \leq 1$, $0<m$, $0 \leq n$, $0<m+n \leq 1$) layer can be set within a range from 50 nm to 1500 nm.

Since, therefore, the thickness of the p-type $In_xGa_yAl_zB_{1-x-y-z}N_mP_nAs_{1-m-n}$ layer is defined within an adequate range, the function of low resistance can easily and reliably be carried out.

The present invention is directed to a method of manufacturing a nitride system semiconductor device, comprising the steps of:

forming an n-type $In_xGa_yAl_zB_{1-x-y-z}N_mP_nAs_{1-m-n}$ ($0 \leq x$, $0 \leq y$, $0 \leq z$, $0 \leq x+y+z \leq 1$, $0<m$, $0 \leq n$, $0<m+n \leq 1$) layer on a substrate by metalorganic chemical vapor deposition;

forming at least a p-type $In_xGa_yAl_zB_{1-x-y-z}N_mP_nAs_{1-m-n}$ ($0 \leq x$, $0 \leq y$, $0 \leq z$, $0 \leq x+y+z \leq 1$, $0<m$, $0 \leq n$, $0<m+n \leq 1$) layer after the n-type $In_xGa_yAl_zB_{1-x-y-z}N_mP_nAs_{1-m-n}$ layer is formed;

forming a p-side electrode on the p-type $In_xGa_yAl_zB_{1-x-y-z}N_mP_nAs_{1-m-n}$ layer; and forming an n-side electrode on one of the substrate and one of the n-type $In_xGa_yAl_zB_{1-x-y-z}N_mP_nAs_{1-m-n}$ layer and the p-type $In_xGa_yAl_zB_{1-x-y-z}N_mP_nAs_{1-m-n}$ layer so as to form a current path extending at least from the p-side electrode through the n-type $In_xGa_yAl_zB_{1-x-y-z}N_mP_nAs_{1-m-n}$ layer and the p-type $In_xGa_yAl_zB_{1-x-y-z}N_mP_nAs_{1-m-n}$ layer.

As described above, the p-type $In_xGa_yAl_zB_{1-x-y-z}N_mP_nAs_{1-m-n}$ layer is directed to one or both of a layer whose oxygen concentration in close vicinity to the surface is $5 \times 10^{18}$ cm$^{-3}$ or lower and a layer whose carbon concentration in close vicinity to the surface is $5 \times 10^{19}$ cm$^{-3}$ or lower.

The manufacturing method is characterized in that the p-type $In_xGa_yAl_zB_{1-x-y-z}N_mP_nAs_{1-m-n}$ layer is formed using at least both a material gas containing an organic magnesium compound and ammonia and a carrier gas, which is essentially a nitrogen gas, by the metalorganic chemical vapor deposition.

Since, therefore, the carrier gas is substantially nitrogen gas, hydrogen is too difficult to be combined with magnesium and thus the magnesium can be activated without heat treatment. In other words, the method decreases in cost and improves in productivity without heat treatment after the growth, and increases the quality of a p-type conductive layer and lengthening the lifetime of the device, thereby improving in reliability.

According to the manufacturing method described above, the nitrogen gas can be employed as the main carrier gas. The material gas can include organic magnesium (Mg) compound, organic gallium (Ga), and organic aluminum (Al) compound. Hydrogen gas can be employed as the carrier gas in addition to the main carrier gas. The concentration of hydrogen gas in the reaction tube can be set within a range of 0.05 to 20 capacity percent, but it is preferable that 2 capacity percent or less.

The magnesium in the semiconductor layer is thus activated by the use of nitrogen gas. The magnesium in the material gas is easy to enter the semiconductor layer by promoting decomposition of the material gas by the hydrogen gas. Consequently, the activation rate of magnesium can be improved further in addition to the foregoing function. Further, since using some little hydrogen carrier gas in addition to main carrier gas, semiconductor layer can be grown with lower temperature, in addition, there are effects of improvement of increase of growth rate and flatness of the surface of the growth layer.

The flow rate of the nitrogen gas can fall within a range of 5 to 2000 times as high as that of the hydrogen gas. Since, therefore, both the growth atmosphere capable of preventing activation of magnesium when the flow rate of nitrogen is 5 times lower than that of hydrogen gas and the growth atmosphere capable of preventing decomposition of material gas of magnesium when the flow rate of nitrogen is 2000 times higher than that of hydrogen gas, can be excluded, the above-described function can easily and reliably be carried out, and the stability of the manufacturing process can be improved.

The p-type $In_xGa_yAl_zB_{1-x-y-z}N_mP_nAs_{1-m-n}$ ($0 \leq x$, $0 \leq y$, $0 \leq z$, $0 \leq x+y+z \leq 1$, $0 < m$, $0 \leq n$, $0 < m+n \leq 1$) layer can be formed by introducing active nitrogen by the MOCVD. The active nitrogen can be introduced using, e.g., reduced-pressure CVD, photo-excited CVD and cracking methods.

If the layer is formed by adding magnesium using one of the reduced-pressure CVD, photo-excited CVD and cracking methods by the MOCVD, the vacancies of the N site of GaN can be reduced to allow magnesium to easily enter the Ga site; therefore, the activation rate of magnesium can be improved further in addition to the foregoing function. Also, since using the active nitrogen, a use quantity of ammonia gas can be much decreased, an effect of increasing the activation ratio of Mg can be obtained, and there is a merit in which production coasts can be much decreased.

The above objects of the present invention, and the other objects, features and advantages thereof will be clarified further by the following detailed descriptions and attached drawings. The same reference numerals appearing in the drawings indicate the same constituting elements of the present invention.

BRIEF DESCRIPTION OF THE SEVERAL VIEWS OF THE DRAWING

The file of this patent contains at least one drawing executed in color. Copies of this patent with color drawings will be provided by the Patent and Trademark Office upon request and payment of the necessary fee.

FIG. 5 is a view of the in-plane distribution of carbon concentrations in the first embodiment;

FIG. 6 is a view of the in-plane distribution of oxygen concentrations in the first embodiment;

FIG. 13 is a diagram showing the wafer in-plane distribution of growth rate of the GaN layer by comparing nitrogen carrier gas and hydrogen carrier gas;

FIG. 14 is a diagram showing the dependence of the growth rate of the GaN layer upon the growth temperature by comparing nitrogen carrier gas and hydrogen carrier gas;

FIG. 15 is a diagram showing the dependence of the acceptor concentration of the p-type conductive layer upon the growth temperature by comparing nitrogen carrier gas and hydrogen carrier gas;

FIG. 16 is a diagram showing the wafer in-plane distribution of Al compositions of the GaAlN layer used as a current injection layer by comparing nitrogen carrier gas and hydrogen carrier gas;

FIG. 17 is a cross-sectional view illustrating the structure of a semiconductor laser according to a second embodiment of the present invention;

FIG. 18 is a cross-sectional view illustrating the structure of a light emitting diode according to a third embodiment of the present invention;

FIG. 19 is a cross-sectional view illustrating the structure of a nitride system semiconductor device according to a fifth embodiment of the present invention;

FIG. 21 is a table showing the results of C-V measurement of the fifth embodiment and the prior art;

FIG. 22 is a view of a modified structure of the fifth embodiment;

FIG. 23 is a view of another modified structure of the fifth embodiment;

FIG. 24 is a view of still another modified structure of the fifth embodiment;

FIG. 25 is a cross-sectional view showing the principle of a nitride system semiconductor device according to a sixth embodiment of the present invention;

FIG. 31 is a view of a modified structure of the seventh embodiment;

FIG. 32 is a view of a modified structure of the seventh embodiment;

FIG. 33 is a cross-sectional view showing the principle of a semiconductor laser according to an eighth embodiment of the present invention;

FIGS. 34A to 34D are views showing a process of manufacturing the semiconductor laser of the eighth embodiment;

FIGS. 38A to 38C are views showing a process of manufacturing the semiconductor laser of the ninth embodiment.

DETAILED DESCRIPTION OF THE INVENTION

Embodiments of the present invention will now be described with reference to the accompanying drawings.
(First Embodiment)

Figure 1:
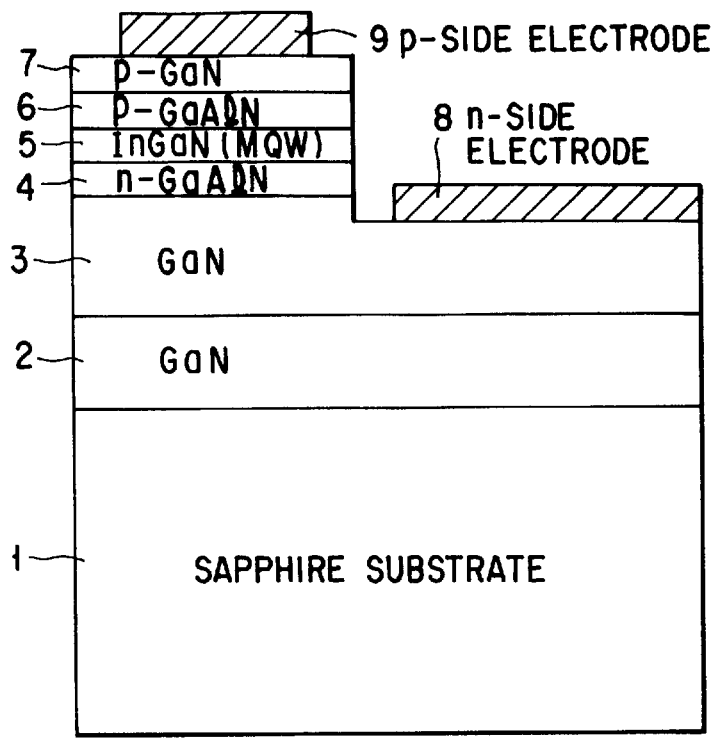
FIG. 1 is a schematic view of the structure of a prior art blue semiconductor laser.
Figure 3:
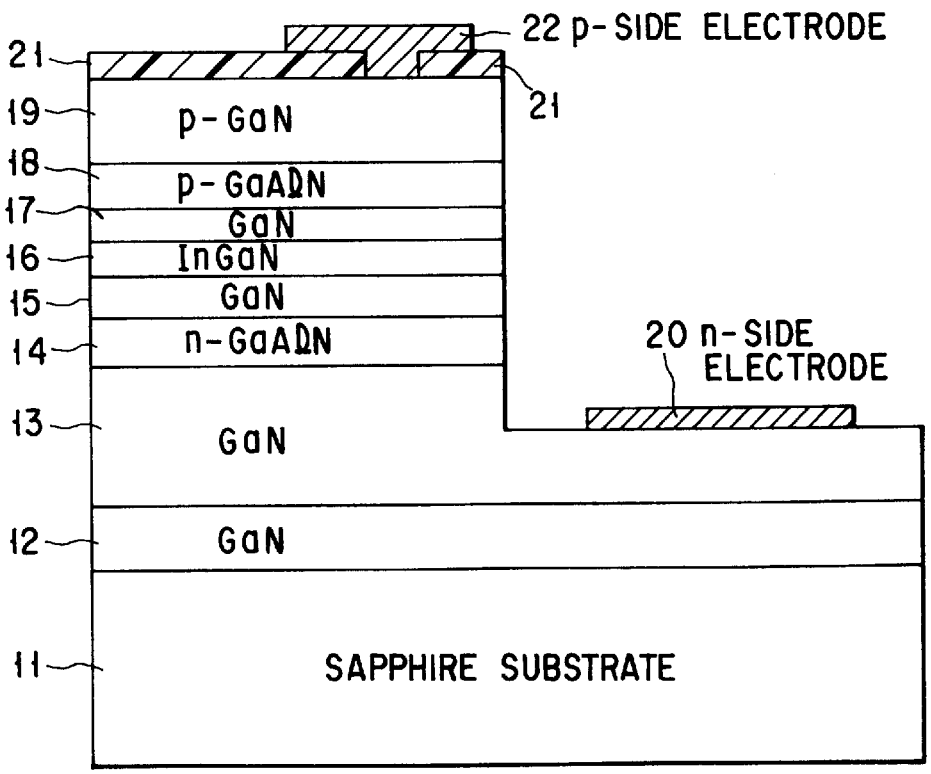
FIG. 3 is a cross-sectional view illustrating the structure of a semiconductor laser according to a first embodiment of the present invention.
Figure 2:
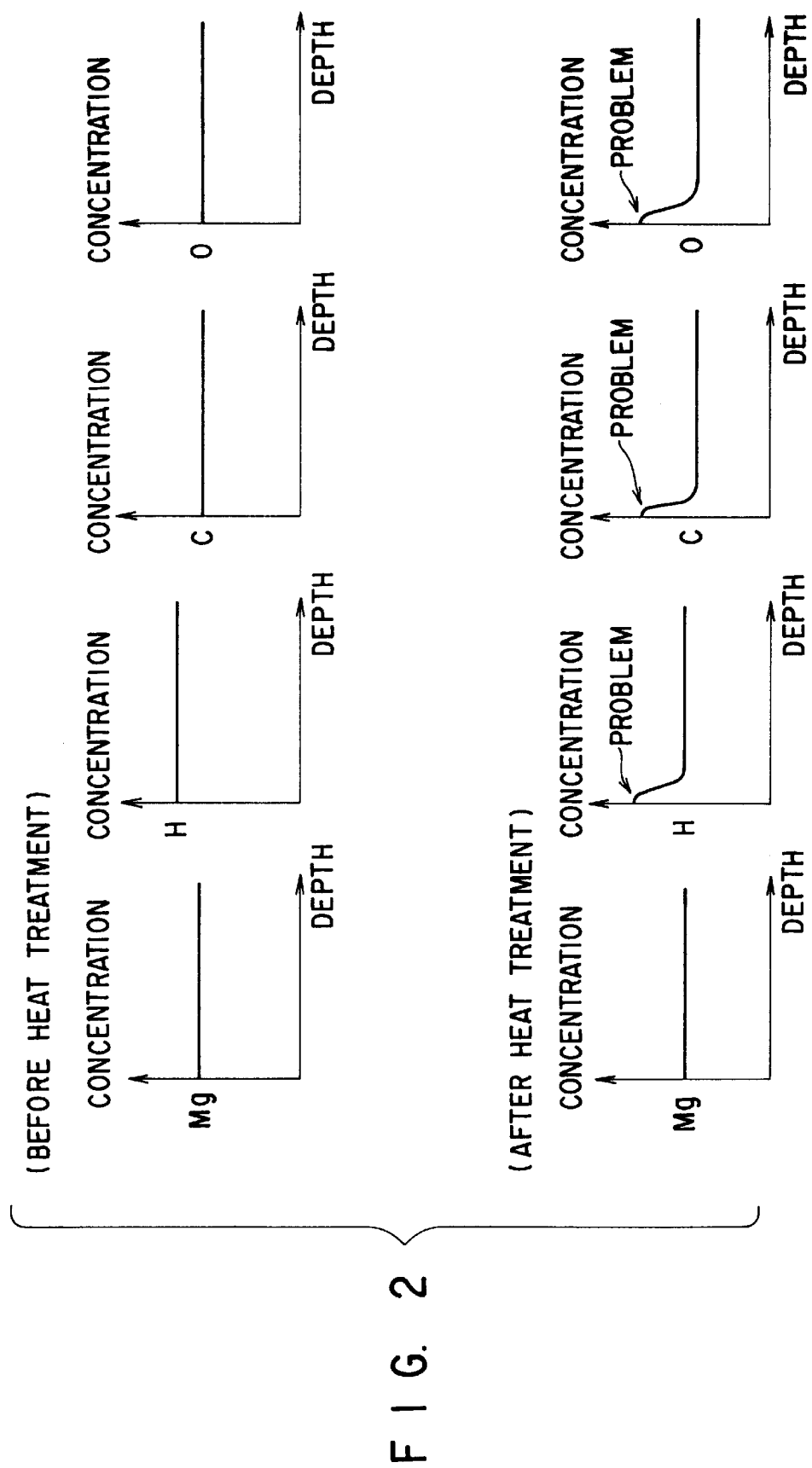
FIG. 2 is a plurality of diagrams showing the distribution of concentrations in the depth direction before and after the heat treatment in the prior art blue semiconductor laser.

FIG. 3 is a cross-sectional view of the structure of a semiconductor laser according to a first embodiment of the present invention. The semiconductor laser has a multilayer structure in which a buffer layer (not shown), an undoped GaN underlying layer 12, an n-type GaN contact layer 13, an n-type GaAlN current injection layer 14, a GaN optical guide layer 15, an InGaN active layer 16, a GaN optical guide layer 17, a p-type GaAlN current injection layer 18, and a p-type GaN contact layer 19 are formed in sequence on a sapphire substrate 11.

Part of the multilayer structure is removed by dry etching to such a depth so as to reach the n-type GaN contact layer 13 from the uppermost surface of the p-type GaN contact layer 19, and an n-side electrode 20 is formed on the exposed surface of the GaN contact layer 13.

An $SiO_2$ layer 21 is selectively formed on the unremoved part of the p-type GaN contact layer 19, and a p-side electrode 22 is formed on the $SiO_2$ layer 21 and p-type GaN contact layer 19.

The semiconductor laser of the first embodiment includes the n- and p-side electrodes in the multilayer structure.

Though described in detail later, during the formation of the layers 18 and 19 and in the temperature decreasing step thereafter, nitrogen is employed as carrier gas with a view to activating magnesium by preventing a compound of magnesium and hydrogen from being formed. Hydrogen is used as carrier gas of organic material containing p-type dopant in order to improve in decomposition of the organic material.

A method for manufacturing the foregoing semiconductor laser and a function thereof will now be described.

The semiconductor laser is manufactured by the well-known MOCVD. Specifically, trimethylgallium (TMG), trimethylaluminum (TMA), trimethylindium (TMI), and bis-cyclopentadienylmagnesium ($Cp_2Mg$) are used as organometallic materials. Ammonia ($NH_3$) and silane ($SiH_4$) are employed as gas materials, and hydrogen and nitrogen are used as carrier gas.

First, the sapphire substrate 11 undergoes organic cleaning and acid cleaning, and is placed on a susceptor which is heated by high frequency in a reaction chamber of MOCVD equipment. A natural oxide film is removed from the surface of the sapphire substrate 11 by vapor phase etching for about ten minutes at a temperature of 1200° C. in the atmosphere into which hydrogen is introduced at a flow rate of 25 L(liter)/m(minute) at normal pressure.

Then, a buffer layer is formed on the sapphire substrate 11 at a low temperature of about 550° C. When the temperature of the substrate is 1100° C., hydrogen is caused to flow at the rate of 20.5 L/m as carrier gas, and ammonia is supplied at the rate of 9.5 L/m for 60 minutes, while trimethylgallium (TMG) is supplied at the rate of 100 cc/m for 60 minutes, thereby forming an undoped GaN underlying layer 12 on the buffer layer.

Silane ($SiH_4$) is caused to flow at the rate of 10 cc/m to form an n-type GaN contact layer 13, and trimethylaluminum (TMA) is caused to flow at the rate of 60 cc/m to form an n-type GaAlN current injection layer 14. Then, the supply of $SiH_4$ and TMA is stopped, and a GaN optical guide layer 15 is formed under the same conditions as the undoped GaN underlying layer 12 is done.

After that, if the temperature of the substrate is decreased to 780° C., the carrier gas is changed from hydrogen to nitrogen flowing at the rate of 20.5 L/m, ammonia, TMG and TMI are caused to flow for about 30 minutes at the rates of 9.5 L/m, 9 cc/m and 465 cc/m, respectively, an InGaN active layer 16 is formed.

After the layer 16 is formed, the temperature of the substrate is increased again to 1100° C. When the temperature reaches 1100° C., the carrier gas is changed again to hydrogen flowing at the rate of 20.5 L/m, and a GaN optical guide layer 17 is formed under the same condition as the GaN optical guide layer 15.

The GaN optical guide layer 17 can be formed using nitrogen as carrier gas and, in this case, the InGaN active layer 16 can be prevented from evaporating when it is exposed to high-temperature hydrogen.

The carrier gas in the subsequent growing process and temperature-decreasing process was changed as follows, and three nitride system blue semiconductor lasers corresponding to one concrete example of the present invention and two comparative examples of the prior art, were produced and their characteristics were compared with each other.

Concrete Example of the Present Invention

A p-type conductive layer was formed according to the present invention and, in other words, it was formed as follows using nitrogen as carrier gas in the growing process of the p-type conductive layer and its subsequent temperature-decreasing process.

After the GaN optical guide layer 17 was formed, the carrier gas was changed to nitrogen flowing at the rate of 20.5 L/m, and ammonia, TMG, TMA, and Cp$_2$Mg of p-type dopant materials were supplied at the rates of 9.5 L/m, 100 cc/m, 60 cc/m, and 25 cc/m, respectively, and a p-type GaAlN layer 18 having a thickness of 0.25 μm was formed on the GaN optical guide layer 17. The flow rate of Cp$_2$Mg was increased to 50 cc/m, and a p-type GaN contact layer 19 having a thickness of 0.7 μm was formed.

In this example, hydrogen gas of a small amount is also used in addition to nitrogen gas which is the main carrier gas. The reason for using hydrogen gas will be described. In this process, it is preferred to adopt low-temperature growth method after the active layer is grown in order to prevent a deterioration of InGaN system active layer. In the low-temperature growth method, the use of hydrogen gas can improve the decomposition efficiency of material so as to increase the growth rate, the flatness of the surface of the growth layer, the decomposition efficiency of the organic Mg material so as to increase an amount of Mg which is taken into the growth layer. The concentration of hydrogen into a reaction tube can be selected appropriately and can fall within a range of, for example, 0.05 to 20 capacity percent.

In the growing process of the p-type conductive layer, it is desirable that the ratio of gaseous ammonia (NH$_3$) to nitrogen used as the main carrier gas be in the vicinity of 0.5 and range from 0.1 to 10. If the ratio is low, the p-type conductive layer grows like an island and good morphology is not obtained, whereas if the ratio is high, a problem of crystal defect or the like will occur.

After the p-type GaN contact layer 19 grew, the supply of the organometallic material was stopped, and only the nitrogen carrier gas and ammonia continued to flow at the rates of 20.5 L/m and 9.5 L/m, respectively, and the temperature of the substrate was naturally decreased. However, the supply of ammonia is stopped when the temperature of the substrate reaches 350° C.

Comparative Example 1

This example is the same method as that of the prior art described in the Background of the Invention. Hydrogen is used as the main carrier gas in the growing process of a p-type conductive layer and its subsequent temperature-decreasing process.

Comparative Example 2

Hydrogen is used as the main carrier gas in the growing process of a p-type conductive layer. In the temperature-decreasing process subsequent thereto, nitrogen is used as the main carrier gas, as in the above concrete example of the present invention.
(Evaluation)
(C-V measurement)

The acceptor concentration of the p-type conductive layer was obtained by applying the C-V technique to each of three samples of the foregoing concrete example and comparative examples 1 and 2.

As the sample of the concrete example, the p-type conductive layer was obtained without heat treatment. In this sample, the acceptor concentration of p-type GaAlN current injection layer 18 was $6 \times 10^{18}$ cm$^{-3}$, and that of p-type GaN contact layer 19 was $9 \times 10^{18}$ cm$^{-3}$. In other words, magnesium (Mg) was activated as an acceptor in both the p-type conductive layers 18 and 19.

The samples of comparative examples 1 and 2 were each formed as a high-resistance conductive layer without heat treatment, not of a p type. These sample were thermally treated for 30 minutes at 750° C. in the nitrogen atmosphere and then underwent C-V measurement. Thus, the acceptor concentration of p-type GaAlN current injection layer 18 was $4 \times 10^{18}$ cm$^{-3}$, while that of p-type GaN contact layer 19 was $4 \times 10^{18}$ cm$^{-3}$. Magnesium was activated as an acceptor.
(I-V measurement)

An n-type electrode 20 and a p-type electrode 22 were formed for each of the above three samples to obtain an electrode-mounted sample having the structure shown in FIG. 3.

In the electrode-mounted sample of the concrete example, good ohmic contact was achieved and, in those of the comparative examples 1 and 2, the ohmic contact was poor.
(Laser emission characteristics)

Semiconductor lasers were manufactured from the above three electrode-mounted samples and their characteristics were evaluated. More specifically, the electrode-mounted samples (wafers) were cleaved to the size of 350 μm to form resonant mirrors, resulting in three semiconductor lasers.

In the semiconductor laser of the concrete example of the first embodiment, when the operation voltage was 5V and the threshold current density is 5 kA/cm$^2$, a laser beam with a wavelength of 420 nm was emitted continuously at a room temperature.

In the semiconductor lasers of the comparative examples 1 and 2 of the prior art, the operation voltage was increased to 35V, no laser beam was emitted, and the device was destroyed due to deterioration in the vicinity of the p-side electrode.
(Distribution of impurity concentrations in depth direction)

For the three samples, the distribution of concentrations of each of magnesium (Mg), hydrogen (H), carbon (C) and oxygen (O) in the depth direction of a growing layer before and after heat treatment, was obtained by SIMS (Secondary Ion Mass Spectrometry).

Figures 4A, 4B:
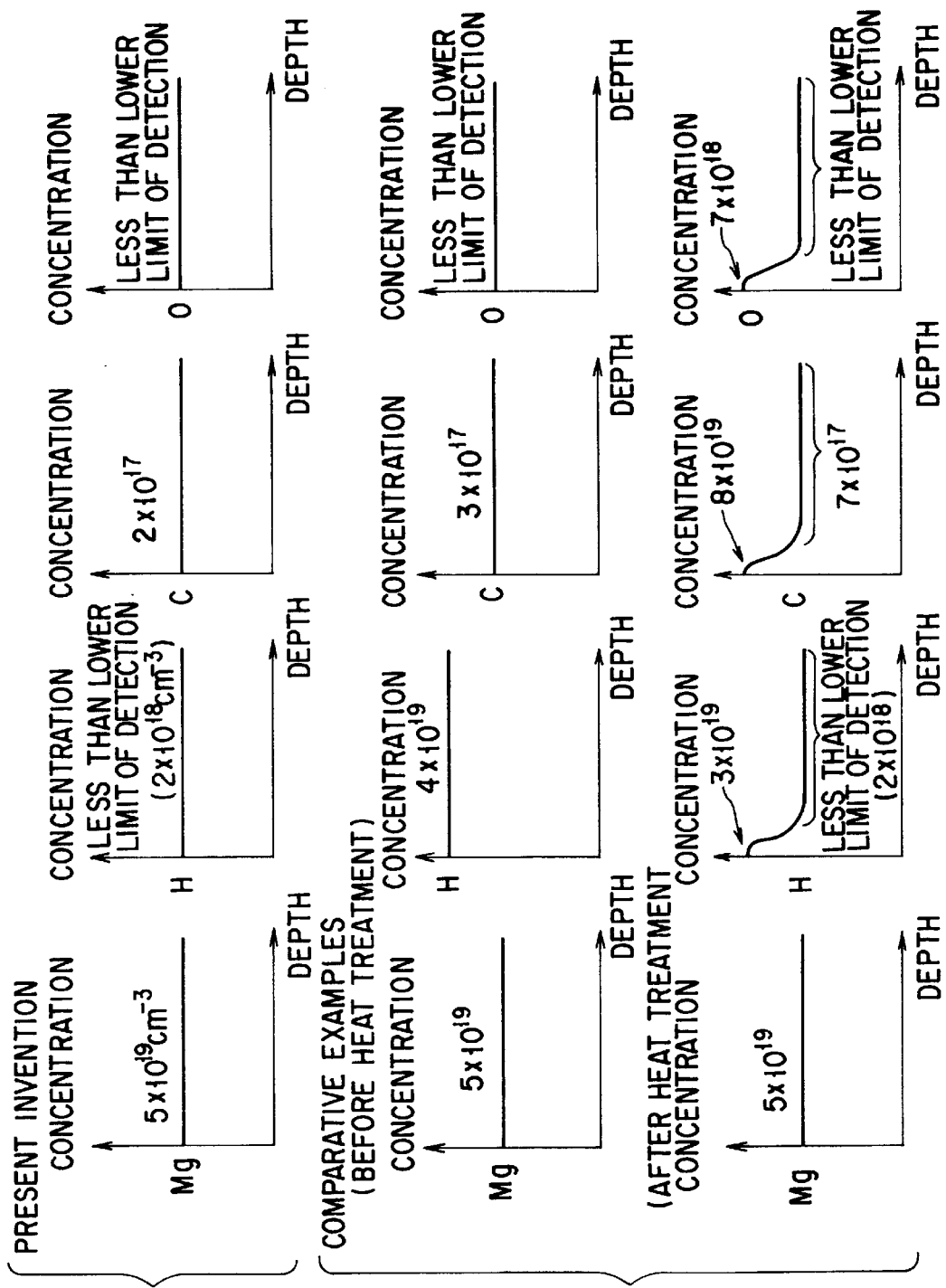
FIG. 4A is a plurality of diagrams showing the distribution of concentrations in the depth direction in the semiconductor laser of the first embodiment.
FIG. 4B is a plurality of diagrams showing the distribution of concentrations in the depth direction before and after the heat treatment in comparative examples.
Figure 7:
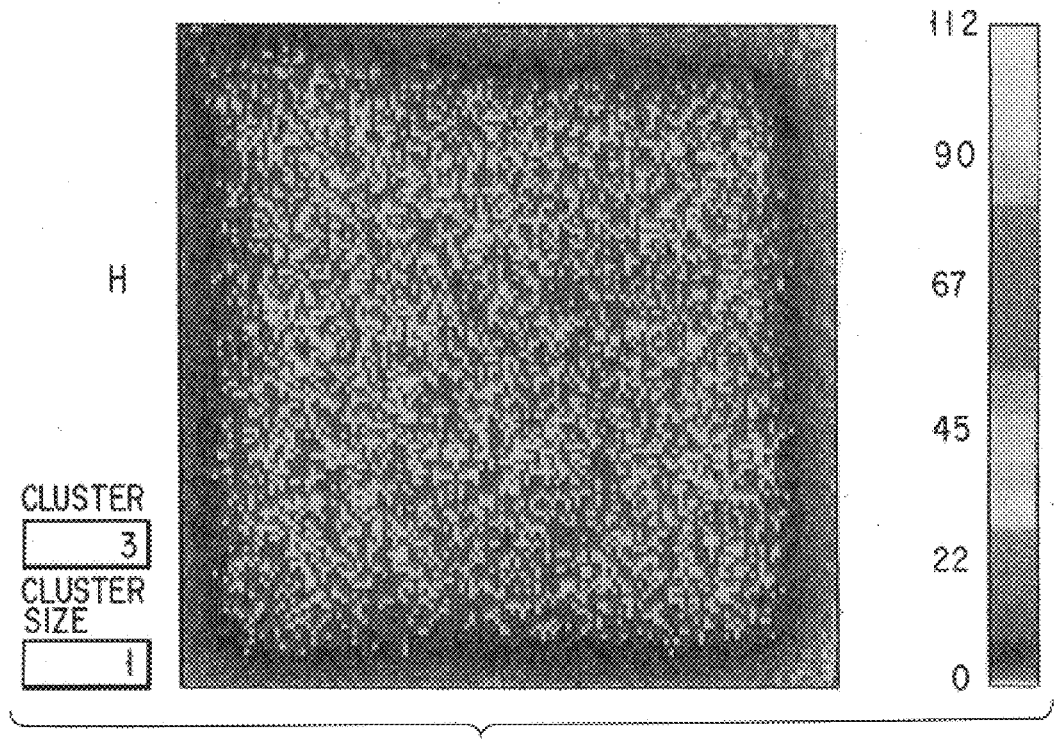
FIG. 7 is a view of the in-plane distribution of hydrogen concentrations in the first embodiment.
Figure 8:
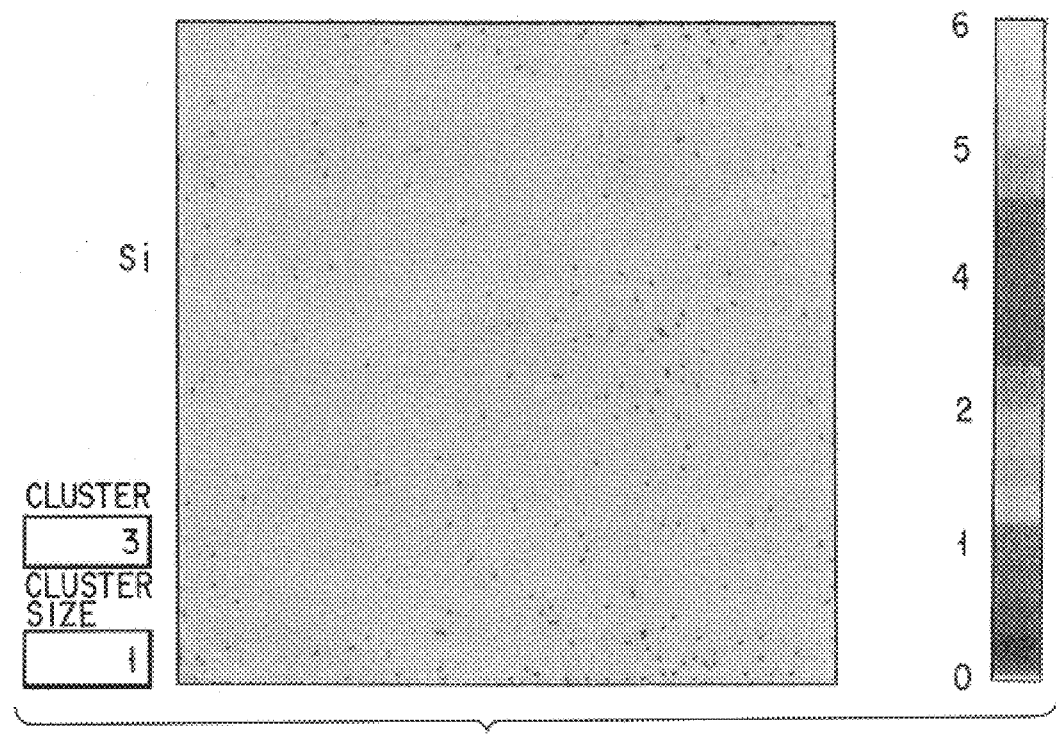
FIG. 8 is a view of the in-plane distribution of silicon concentrations in the first embodiment.

In the sample of the concrete example of the first embodiment, as shown in FIG. 4A, the concentration of magnesium was as constant as about $5 \times 10^{19}$ cm$^{-3}$ in the depth direction. The concentration of hydrogen was not higher than the lower limit ($2 \times 10^{18}$ cm$^{-3}$), and no hydrogen was detected from the uppermost surface of the growing layer. The concentration of carbon was as constant as about $2 \times 10^{17}$ cm$^{-3}$ in the growing layer, and that of oxygen was not higher than the lower limit ($1 \times 10^{17}$ cm$^{-3}$).

In the comparative examples 1 and 2, as shown in FIG. 4B, the concentration of magnesium was about $5 \times 10^{19}$ cm$^{-3}$, irrespective of before and after the heat treatment, as in the concrete example of the first embodiment.

Furthermore, in the comparative examples 1 and 2, the concentration of hydrogen was about $4 \times 10^{19}$ cm$^{-3}$ before the heat treatment. After the heat treatment, the concentration of hydrogen was not higher than the lower limit ($2 \times 10^{18}$ cm$^{-3}$) in the multilayer growing film but increased to about $3 \times 10^{19}$ cm$^{-3}$ on the uppermost surface of the growing layer. Even though heat treatment was added for thirty minutes, hydrogen with a concentration of about $3 \times 10^{19}$ cm$^{-3}$ was detected from the uppermost surface of the growing layer.

In the comparative examples 1 and 2, before the heat treatment, the concentration of carbon was as constant as about $3 \times 10^{17}$ cm$^{-3}$ in the growing layer and, after the heat treatment, it was increased to about $8 \times 10^{19}$ cm$^{-3}$ on the surface of the growing layer. The concentration of oxygen before the heat treatment was not higher than the lower limit ($1 \times 10^{17}$ cm$^{-3}$), and it was about $7 \times 10^{18}$ cm$^{-3}$ in the vicinity of the surface after the heat treatment. The oxygen concentration (about $7 \times 10^{18}$ cm$^{-3}$) after the heat treatment was the lowest value as the result of measurement and usually it becomes higher by about one figure or more.

(In-plane distribution of impurity concentrations)

For the samples of the above concrete example and comparative example 1, the in-plane distribution of impurity concentrations was examined by the SIMS in the vicinity of the surface of a p-type contact layer. The impurities of the concrete example and the comparative example 1 were directed to carbon (C), oxygen (O), hydrogen (H) and silicon (Si). The results of the first embodiment are shown in FIGS. 5 to 8, and those of the prior art are illustrated in FIGS. 9A to 12. Of these figures, FIGS. 5, 6, . . . , and 12 illustrate the in-plane distribution of impurity concentrations. The number of counts of impurity clusters is distinguished using different colors based on a table showing a correlation between the number of counts and color.

As shown in FIGS. 5, 6, 7 and 8, the distribution of concentrations of each of carbon, oxygen, hydrogen and silicon is substantially uniform on the plane corresponding to a depth of 100 nm from the surface, and no locally high-concentration portion appears in any of the impurities. Specifically, the maximum concentration of each of the impurities was five or less times as high as the average of concentrations of the same impurity.

As for the sample of comparative example 1, the descriptions of FIGS. 9A, 9B, 10 to 12 will be made first and then the distribution of concentrations of each impurity will be described.

FIGS. 9A, 9B, 10, 11 and 12 correspond to FIGS. 5, 6, 7 and 8 described above and each show the number of counts of clusters of each impurity by using different colors.

In the sample of comparative example 1, as shown in FIGS. 9A, 9B, 10, 11 and 12, a locally high-concentration portion is present in the in-plane distribution of concentrations of each of carbon, oxygen, hydrogen and silicon.

The value of the locally high-concentration portion is about ten times as large as that of the average concentration portion. Specifically, in the concentration of carbon, the value of the high-concentration portion is $3 \times 10^{19}$ cm$^{-3}$ and that of the average concentration portion is $2 \times 10^{17}$ cm$^{-3}$ and, in this case, the value of the high-concentration portion is larger than that of the average concentration portion by about two figures.

Figure 9A:
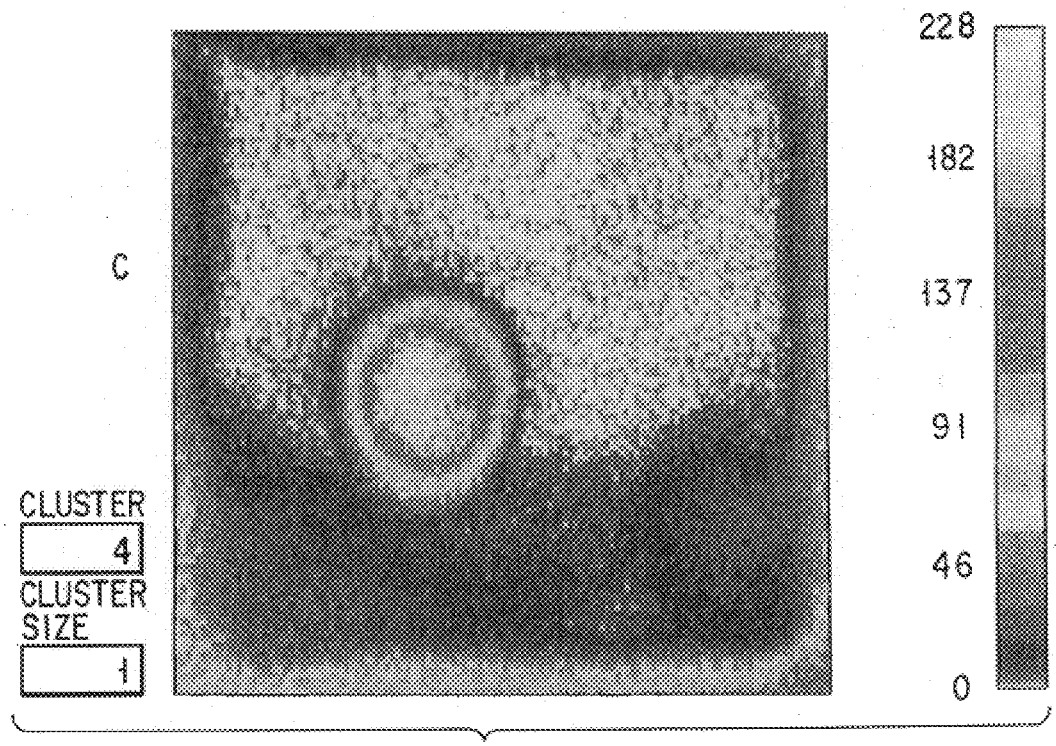
FIG. 9A is a view of the in-plane distribution of carbon concentrations of the depth of 100 nm in the comparative examples.
Figure 9B:
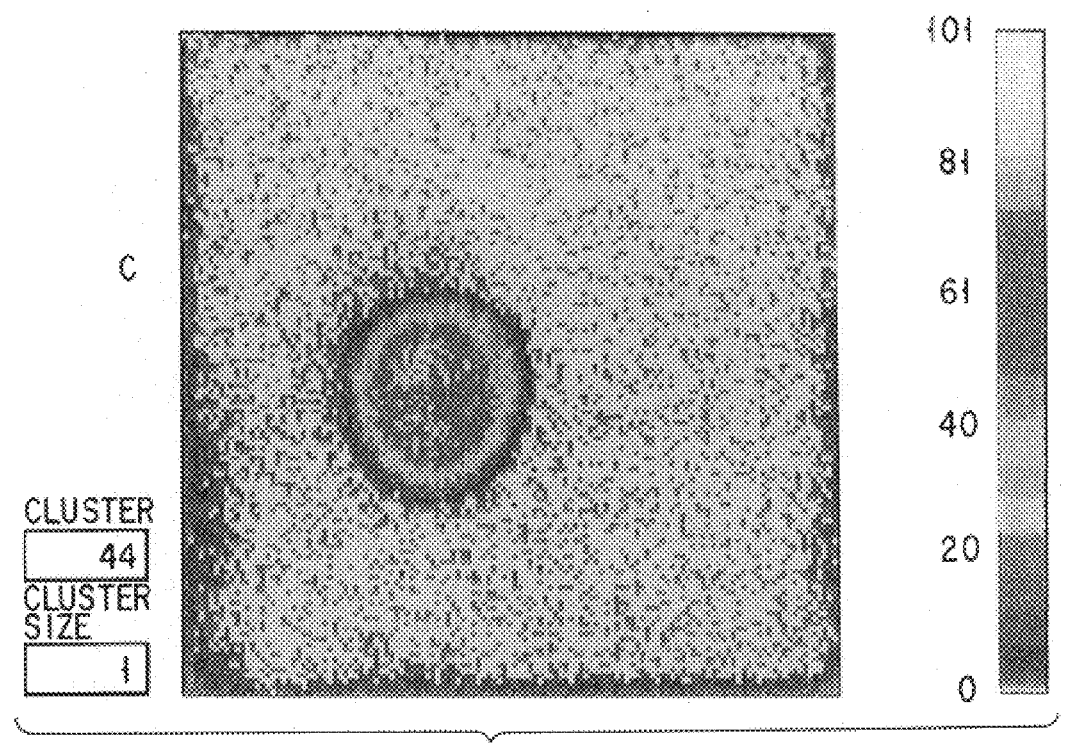
FIG. 9B is a view of the in-plane distribution of carbon concentrations of the depth of 1000 nm in the comparative examples.
Figure 10:
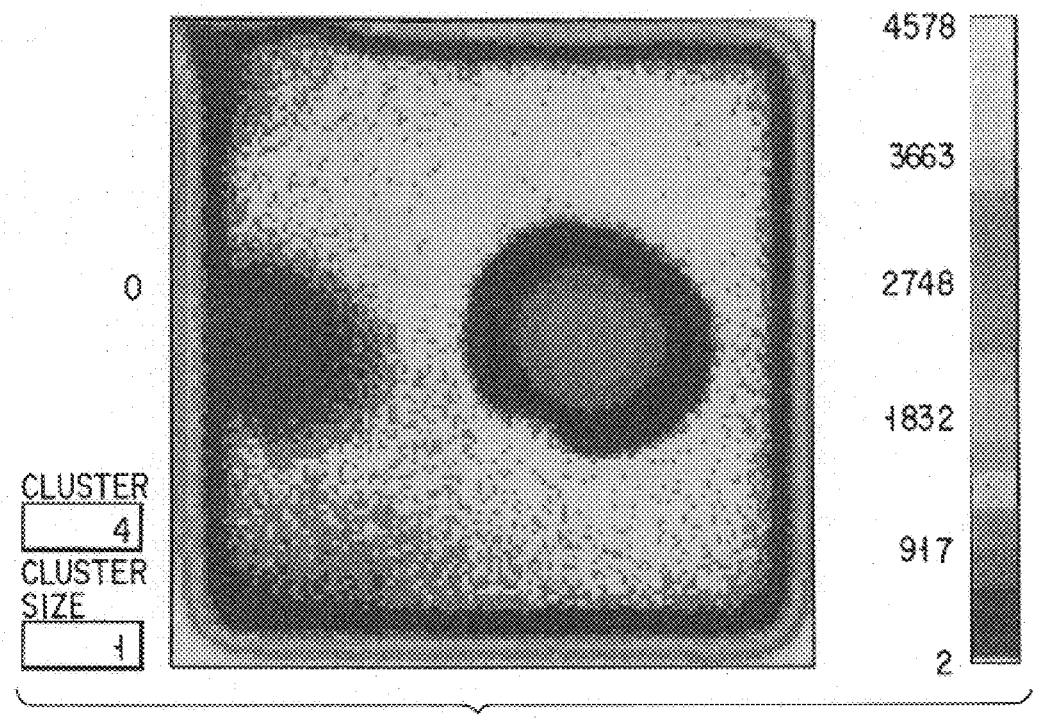
FIG. 10 is a view of the in-plane distribution of oxygen concentrations in the comparative examples.
Figure 11:
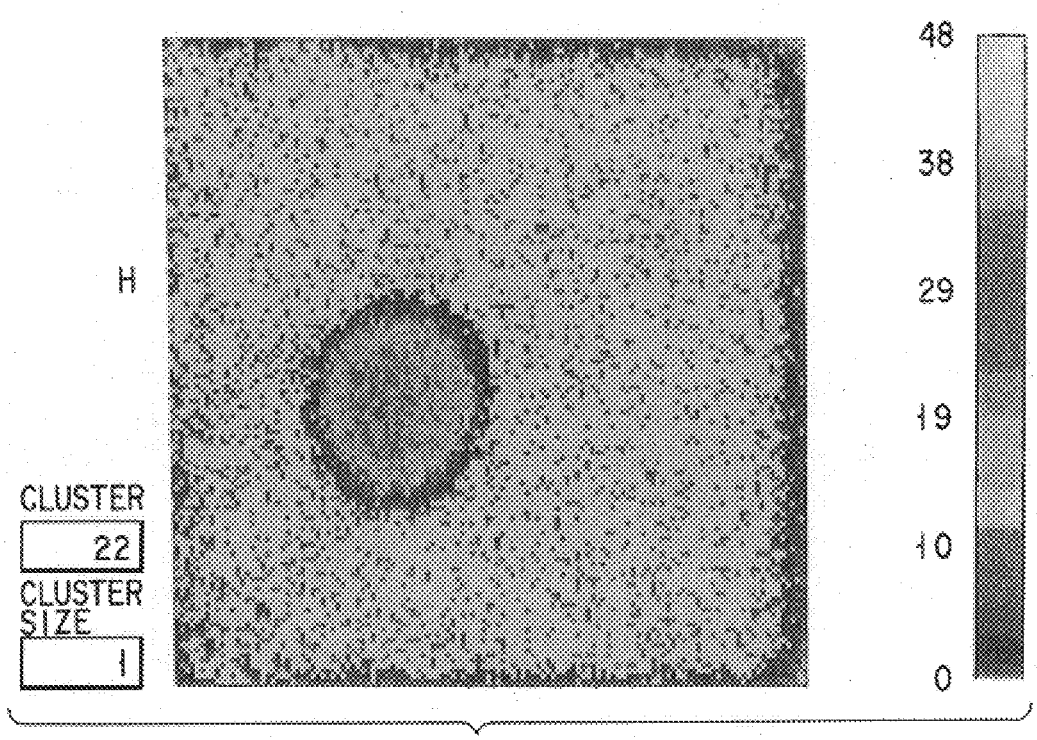
FIG. 11 is a view of the in-plane distribution of hydrogen concentrations in the comparative examples.
Figure 12:
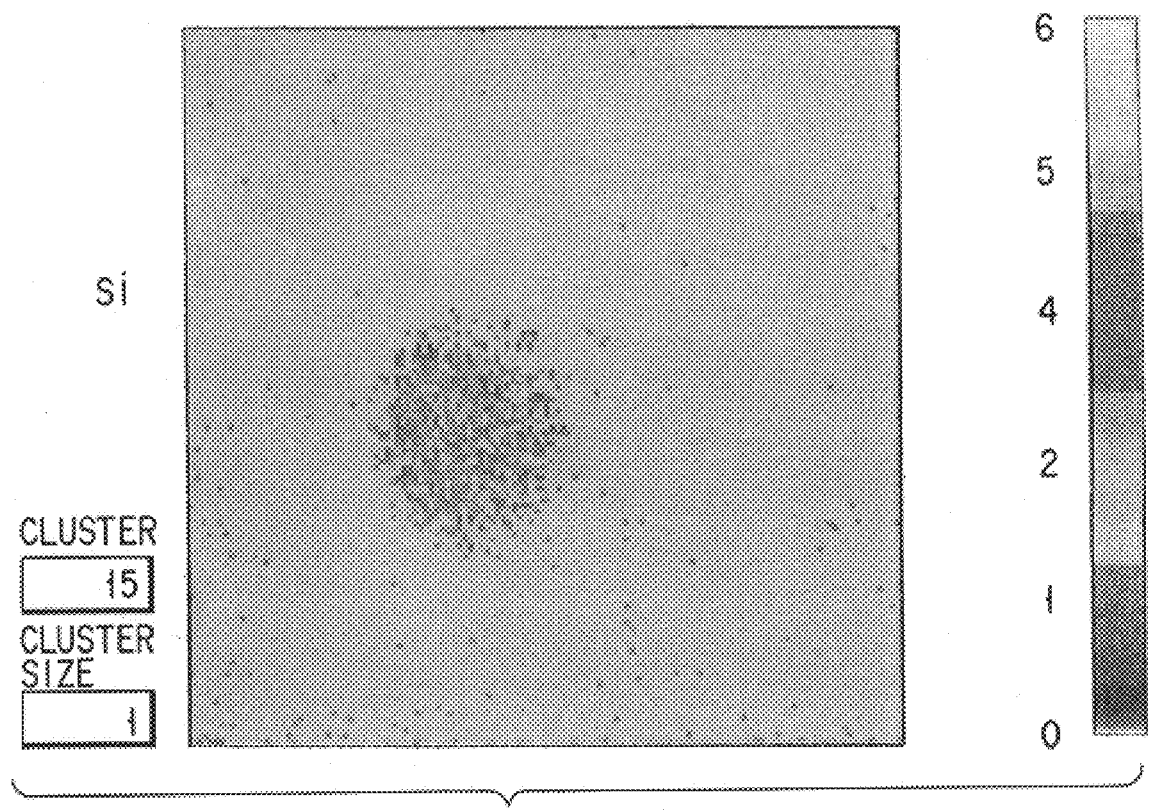
FIG. 12 is a view of the in-plane distribution of silicon concentrations in the comparative examples.

As illustrated in FIGS. 9B, locally high-concentration portions of the carbon and oxygen (not shown) impurity concentrations are present at a position corresponding to the depth of 1 μm from the uppermost surface. In contrast, the sample of the first embodiment has no locally high-concentration portions of the carbon and oxygen impurity concentrations; however, if the sample is annealed, such a high-concentration portion will occur.

In the comparative example 1, the locally high-concentration portion in the carbon and oxygen impurity concentrations makes current injection nonuniform, generates a non-emitting region, and adversely influences a guided wave, resistance, electromigration, deformation, and thermal characteristics, thereby decreasing in reliability. Such a problem does not arise in the concrete example of the first embodiment.

Though not described specifically, the sample of the comparative example 1 has a locally high-concentration portion in the hydrogen and silicon impurity concentrations, whereas the example of the first embodiment does not have such a portion.

(Variations in characteristics with carrier gas)

The difference in characteristics between the concrete example of the first embodiment and the comparative example 1 of the prior art was examined. In the present invention, nitrogen gas was employed as the main carrier gas. The results of the examination are shown in FIGS. 13 to 16. In these figures, "nitrogen carrier gas" indicates the example of the first embodiment and "hydrogen carrier gas" does the comparative example 1 of the prior art.

FIG. 13 is a diagram of the distribution of growth rates on the GaN layer or the in-plane distribution of thicknesses of the layer within the wafer. In this figure, the ordinate indicates the growth rate corresponding to the thickness of the layer, and the growth rate is obtained by dividing the layer thickness by growth time. The thickness was measured by the well-known scanning electron microscope (hereinafter referred to as SEM). The abscissa indicates a predetermined position of gas within the wafer. The upstream side of the wafer is defined as "front," the downstream side thereof is defined as "back" and central the position of the wafer is defined as "center." As shown, the thickness distribution of the present invention is substantially uniform, whereas that of the prior art is not uniform since the growth rate is low on the "center."

FIG. 14 is a diagram showing the dependence of the growth rate (layer thickness) on the GaN layer upon the growth temperature. In this figure, the ordinate denotes the growth rate (as the layer thickness/growth time) of the central part of the GaN layer. The thickness was measured by the SEM. The abscissa indicates the growth temperature. As shown, in the present invention, the thickness of the GaN layer is substantially uniform at the growth temperature of 1000° C. to 1100° C. and, in the comparative example 1, the thickness decreases as the temperature increases from 1050° C. to 1120° C.

FIG. 15 is a diagram showing the dependence of the acceptor concentration (p-type carrier density) on the p-type conductive layers 18 and 19 upon the growth temperature. The acceptor concentration was measured by the known C-V technique. As shown, the acceptor concentration is substantially uniform at the growth temperature of 1000° C. to 1100° C. and, in the comparative example 1, the concentration increases as the temperature rises from 1050° C. to 1150° C.

FIG. 16 is a diagram showing the in-plane distribution of the Al compositions on a GaAlN layer used as the current injection (clad) layer. In FIG. 16, the ordinate indicates the Al composition, and the abscissa does the same as that of FIG. 13. The Al composition was measured by the known X-ray diffractometry (XRD). As shown, the variations in Al composition in the present invention are smaller than those in the comparative example 1.

The following results were obtained from the above experiments.

According to the comparative examples 1 and 2 of the prior art in which a thin film is grown in the hydrogen carrier gas and then rendered a p-type conductive layer by the heat treatment, the concentrations of hydrogen, carbon and oxygen are increased on the uppermost surface of the multilayer structure (the uppermost surface of the p-type contact layer in the case of a light emitting device). It is inferred that the increase in concentration is due to the heat treatment. The hydrogen inactivates magnesium existing on the uppermost surface and at the same time the carbon and oxygen enhances the resistance of the uppermost surface; therefore, no ohmic contact with the p-side electrode can be obtained.

According to the concrete example of the present invention, since the carrier gas in the growth process is substantially nitrogen gas, hydrogen is too difficult to combine with magnesium and thus magnesium can be activated without undergoing the heat treatment. Consequently, no heat treatment has to be carried out after the growth of the layer, and the uneven presence of hydrogen, carbon, oxygen, etc. on the uppermost surface of the growing layer, which is due to the heat treatment, is avoided, thereby preventing magnesium from being inactivated by hydrogen and inhibiting the surface from increasing in resistance by carbon and oxygen.

According to the present invention, the heat treatment after the growth is not required to decrease in costs and improve in productivity, the quality of the p-type conductivity layer is improved, the operation voltage can greatly be lowered even in a semiconductor laser necessary for higher-current injection than a light emitting diode, laser emission can be simplified, the lifetime of the device can greatly be lengthened, and the reliability thereof can be improved.

According to the present invention, unlike in the comparative example 1 of the prior art, there are no local regions of high carbon concentration and high oxygen concentration. Thus, current can be prevented from being injected nonuniformly, a non-emitting region can be prevented from being generated, and an adverse influence upon a guided wave, resistance, electromigration, deformation, and thermal characteristics can be deleted, resulting in reliability.

According to the present invention, since nitrogen gas is employed as the main carrier gas and some little hydrogen gas is contained as another carrier gas, the activation of magnesium in the semiconductor layer is promoted by nitrogen gas, and the decomposition of material gas including magnesium is promoted by hydrogen gas, with the result that the magnesium is easily mixed into the semiconductor layer and the activity of magnesium can be improved further.

According to the first embodiment, since the flow rate of nitrogen gas falls within a range of 5 to 2000 times as high as that of hydrogen gas, both the growth atmosphere capable of preventing activation of magnesium when the flow rate of nitrogen is 5 times lower than that of hydrogen gas and the growth atmosphere capable of preventing decomposition of material gas of magnesium when the flow rate of nitrogen is 2000 times higher than that of hydrogen gas, can be excluded, the above-described advantages can be produced easily and reliably, and the stability of the manufacturing process can be improved.

According to the first embodiment of the present invention, since the growth temperature of a p-type $In_xGa_yAl_zB_{1-x-y-z}N_mP_nAs_{1-m-n}$ ($0<x$, $0 \leq y$, $0 \leq z$, $0<x+y+z \leq 1$, $0<m$, $0 \leq n$, $0<m+n \leq 1$) layer falls within a range of 500° C. to 1230° C., both the region which is lower than 500° C. and not capable of p-type conductivity during the growth and the region which is higher than 1230° C. and not capable of good crystal, can be excluded. Therefore, the foregoing advantages can be obtained easily and reliably, and the stability of the manufacturing process can be improved.

The stability of the manufacturing process of the first embodiment of the present invention is shown in FIGS. 13 to 16.

According to the first embodiment, since the in-plane distribution of the film thicknesses is greatly improved, the yield and reliability can be improved. Since, furthermore, the dependence of the thickness upon the growth temperature is less than that in the prior art, the variations in thickness from run to run can greatly be decreased, and the reproducibility as well as the yield and reliability can be improved.

The first embodiment is improved more greatly in the dependence of acceptor concentration upon growth temperature in the p-type conductive layer than the prior art. Therefore, the variations in acceptor concentration within the wafer or from run to run can be reduced, and the reproducibility, yield and reliability can be improved.

Since the first embodiment of the present invention can be improved in the distribution of Al compositions of a GaAlN layer used as a current injection layer more greatly than the prior art, it can be increased in reproducibility, yield and reliability.

Moreover, the growth temperature of the present invention can be made 40° C. to 60° C. lower than that of the prior art. In other words, the prior art has the problem that when an InGaN system active layer grown at low temperature has a high In (indium) composition rate, if a p-type current injection (clad) layer and a p-type contact layer both grown at high temperature are formed thereon, the quality of crystal will be degraded by the high temperature. Since, in the present invention, the growth temperature can be decreased, the above problem of the prior art can be resolved thereby to maintain the quality of the active layer.

(Second Embodiment)

A semiconductor laser according to a second embodiment of the present invention will now be described.

FIG. 17 is a cross-sectional view of the structure of the semiconductor laser. In this laser, a buffer layer 32, an n-type GaN layer 33, an n-type GaAlN current injection layer 34, a GaN layer 35, an active layer 36 of multiple quantum well (MQW) structure, a GaN layer 37, and a p-type GaAlN current injection layer 38, are formed in sequence on a sapphire substrate 31.

The layers 34 to 38 constitute a double-heterostructure of buried mesa structure using a high-resistance GaN layer 39.

A p-type GaN layer 40 is formed on the layers 38 and 39, and a p-type GaN contact layer 41 is formed on the layer 40.

A p-side electrode 43 is formed on the p-type GaN contact layer 41, while an n-side electrode 42 is formed on the n-type GaN layer part of which is exposed by etching or the like.

A method for manufacturing the foregoing semiconductor laser and a function thereof will now be described.

First, the sapphire substrate 31 is cleaned by an organic solvent and acid, and is placed on a susceptor of MOCVD equipment which can be heated. While hydrogen is caused to flow at a flow rate of 20 L(liter)/m(minute), the surface of the sapphire substrate is removed by vapor phase etching for about ten minutes at a temperature of 1200° C. The temperature is decreased to 550° C., and a buffer layer 32 is formed on the sapphire substrate 31. The temperature is then increased to 1100° C., hydrogen, nitrogen, TMG, ammonia and silane are caused to flow for about one hour at the rates of 15 L/m, 5 L/m, 100 cc/m, 10 L/m and 5 cc/m, respectively, and an n-type GaN layer 33 is formed so as to have a thickness of about 2 μm.

While the temperature of 1100° C. is maintained, an n-type GaAlN current injection layer 34 is formed to have a thickness of about 500 nm by adding TMA for 15 minutes at the flow rate of 50 cc/m, thereafter the addition of TMA is stopped again for 10 minutes to form a GaN layer 35 having a thickness of about 200 nm.

The supply of TMG is stopped, and the temperature of the substrate is decreased to 780° C. At this temperature, TMG, ammonia, hydrogen and nitrogen are caused to flow at the rates of 10 cc/m, 10 L/m, 30 cc/m and 19.7 L/m, respectively, and TMI is supplied thereto for about 1.5 minutes 20 times alternately at the flow rates of 140 cc/m and 15 cc/m and finally supplied for three minutes at the rate of 15 cc/m, thereby forming an active layer 36 of multiple quantum well (MQW) structure.

While hydrogen, nitrogen and ammonia are caused to flow at the rates of 40 cc/m, 19.96 L/m and 10 L/m, respectively, the temperature is increased to 1100° C. for four minutes. If the atmosphere is hydrogen at the rising temperature, the active layer is etched; therefore, it is desirable that the atmosphere be nitrogen.

When the temperature of 1100° C. is held, hydrogen, nitrogen, TMG, ammonia and Cp$_2$Mg are supplied for about 10 minutes at the rates of 500 cc/m, 14.5 L/m, 100 cc/m, 10 L/m and 50 cc/m, respectively, and a GaN layer 37 having a thickness of about 200 nm is formed.

TMA is added thereto for about 15 minutes at the rate of 50 cc/m to form a p-type GaAlN current injection layer 38 having a thickness of about 500 nm. However, hydrogen is used as the carrier gas of organometallic material for forming the above p-type layer and, in this state, the temperature is decreased to the room temperature, the wafer is removed from the MOCVD equipment, and an SiO$_2$ film having a width of 20 μm is formed on the surface of the wafer in the known thermal CVD equipment. The wafer is placed in the RIE equipment and etched so as to have a mesa-structure opening by BCl$_3$ gas. The wafer so produced is placed again on the susceptor of the MOCVD equipment and its temperature is increased to 1100° C. in the nitrogen flowing at the rate of 30 L/m.

When the temperature is 1100° C., hydrogen, nitrogen, TMG, ammonia and DMZ (dimethylzinc) are supplied for about one hour at the rates of 500 cc/m, 14.5 L/m, 100 cc/m, 10 L/m and 50 cc/m, and the layers 34 to 38 constitute a buried structure of the i-type GaN layer 39. Such an i-type GaN layer is formed by the growth after mesa etching; however, it can be formed by implanting ions such as hydrogen and oxygen without etching. For example, the layer can be achieved by implanting hydrogen ions at an acceleration energy of 200 keV with a dosage of $1\times10^{14}$ cm$^{-2}$.

While the temperature of 1100° C. is maintained, the main carrier gas is switched from hydrogen to nitrogen, hydrogen, nitrogen, TMG, ammonia and Cp$_2$Mg are supplied for 27 minutes at the rates of 500 cc/m, 14.5 L/m, 100 cc/m, 10 L/m and 50 cc/m, and a p-type GaN layer 40 is formed to have a thickness of about 900 nm. Furthermore, the flow rate of Cp$_2$Mg is increased to 150 cc/m, and it is supplied for three minutes, thereby to form a p-type GaN layer 41 having a thickness of 100 nm. In this layer, p-type crystal can be achieved without requiring the post-treatment such as heat treatment. When the layers 40 and 41 grow, the inactivation mechanism of carriers is decreased and the concentration thereof is increased about two times by adding zinc with a concentration of $3\times10^{16}$ cm$^{-3}$.

The supply of TMG and Cp$_2$Mg is stopped, and the temperature of the substrate is decreased to the room temperature. However, hydrogen, nitrogen and ammonia continue to be supplied at the rates of 500 cc/m, 14.5 L/m and 10 L/m, respectively, from 1100° C. to 350° C., and the supply of ammonia is stopped at 350° C.

The laser structure so obtained is removed from the MOCVD equipment. Using the well-known vacuum deposition or sputtering, Pt (50 nm in thickness), Ni (50 nm in thickness) and Au (2 μm in thickness) are formed in order on the n-type GaN layer 33 to achieve an n-side electrode 42 having good ohmic contact. On the other hand, Pd (20 nm in thickness), Ti (30 nm in thickness), Pt (20 nm in thickness) and Au (2 μm in thickness) are formed in order on the p-type GaN layer 41, and the structure is subjected to heat treatment for one minute in the nitrogen of 500° C., resulting in ohmic p-side electrode 43 of about $7\times10^{-3}$ Ωcm$^2$. A multilayer structure or an alloy layer of the above metal and Al, Sc, Mg, Si, Cr, etc. can be used for the electrode.

The laser structure is cleaved from the substrate using a scriber or the like to form a resonant mirror. The semiconductor laser so manufactured continuously emits laser beams of wavelength of 420 nm. The operation voltage of this device is 4.7V and the threshold current density is 3 kA/cm$^2$.

As described above, according to the second embodiment of the present invention, a blue semiconductor laser having an internal current blocking structure can be achieved in addition to the advantages of the first embodiment.

As a modification to the second embodiment, the timing at which the main carrier gas is switched is varied when the two p-type GaN layers 40 and 41 are formed. More specifically, under the above conditions, hydrogen is used as the main carrier gas when the lower p-type GaN layer 40 is formed, and hydrogen is changed to nitrogen before the uppermost p-type GaN layer 41 is formed. Even though the layer 41 is formed afterward, the same high activation rate of magnesium can be obtained as that in the first and second embodiments. The reason is as follows. Even if no magnesium is activated when the lower p-type GaN layer 40 is formed, since the growth temperature is as high as 1100° C. when the uppermost p-type GaN layer 41 is formed, it is inferred that a heat treatment effect acts on the layer 40. Needless to say, the activation rate of magnesium is high since the p-type GaN layer 41 is originally formed in the nitrogen atmosphere.

(Third Embodiment)

A light emitting diode according to a third embodiment of the present invention will now be described.

FIG. 18 is a cross-sectional view illustrating the structure of the light emitting diode. This diode includes an n-type, 2H-type SiC substrate 51. A mixed layer 52 containing GaN and SiC in the ratio of 1:9 is formed on the substrate 51, and an n-type GaN layer 53, an n-type InGaN light emitting layer 54, and a p-type GaN layer 55 are formed in order on the substrate 51. The dopant to be used is silicon for the n-type GaN layer 53 and magnesium for the p-type GaN layer 55. Only during the growth of the layers 54 and 55, nitrogen is employed as the main carrier gas, ammonia and organic Ga material are used as the material gas, and organic Mg material is employed as the p-type dopant. Further, hydrogen is used as the carrier gas of organic Mg material.

When the layers other than the p-type GaN layer 55 are grown, hydrogen is used as the main carrier gas. The carrier concentration of each of the layers 53 and 55 is $2\times10^{18}$ cm$^{-3}$.

An n-side electrode 56 is formed on the SiC substrate, while a p-side electrode 57 is formed on the p-type GaN layer 55.

In the light emitting diode produced by forming n- and p-type electrode on a multilayer film so obtained, as described above, the contact resistance of the p-side electrode can be lowered, with the result that the lifetime of the device is lengthened about 5 times as long as that of the prior art device, and the reliability thereof can greatly be improved.

(Fourth Embodiment)

A semiconductor laser according to the fourth embodiment of the present invention will now be described with reference to FIG. 3.

The fourth embodiment is directed to a p-type GaAlN current injection layer 18 and a p-type GaN contact layer 19 which are formed by supplying plasmatic nitrogen using one of reduced-pressure CVD, photo-excited CVD and cracking methods in addition to the foregoing concrete example (first embodiment) of the present invention.

More specifically, as described above, after a GaN optical guide layer 17 is formed, the main carrier gas is switched from hydrogen to nitrogen, and the supply of TMG, TMA and hydrogen gas serving as a carrier gas of these material gases, is stopped.

If, using one of the above methods, the temperature of the substrate is decreased, gaseous ammonia ($NH_3$) continues to be supplied, etc. until active nitrogen atoms can be supplied, Ga, In, N and the like are prevented from being separated from the growing layer formed on the substrate.

Next, a fixed amount of nitrogen gas and that of material gas are introduced, and a reaction chamber is set at a predetermined pressure by controlling exhaust speed or the like.

The p-type GaAlN current injection layer 18 and p-type GaN contact layer 19 are formed in sequence by plasma generated in the reaction chamber.

After that, the supply of the material gas is stopped and the temperature of the substrate is naturally lowered.

The subsequent electrode forming step is the same as described above, and a blue semiconductor laser is completed.

The blue semiconductor laser is capable of continuously emitting a laser beam at a room temperature when a threshold current is as low as 30 mA.

According to the fourth embodiment described above, since the p-type GaAlN current injection layer 18 and p-type GaN contact layer 19 are formed using active nitrogen atoms such as nitrogen plasma, the nitrogen vacancy density can be reduced, and magnesium (Mg) is easy to enter the site of gallium (Ga). Also, since using the active nitrogen, a use quantity of ammonia gas can be much decreased, an effect of increasing the activation ratio of Mg can be obtained, and there is a merit in which production costs can be much decreased.

It is thought that, in the atmosphere of several torr or lower, a large number of vacancies are generated from the site of N of Ga(Al)N, and magnesium (Mg) enters the site of N thereby to easily inactivate the magnesium. In the fourth embodiment, however, since nitrogen plasma is employed, the vacancies of the site of N are decreased, and magnesium enters the site of Ga and is activated; thus, the blue semiconductor laser can continuously emit a laser beam at a room temperature.

The fourth embodiment can be applied to both the p-type GaN layers 40 and 41 of the second embodiment and the p-type GaN layer 55 of the third embodiment. In other words, even though these layers 40, 41 and 55 using plasma, the activation rate of magnesium can be improved as in the fourth embodiment. The plasma may include direct current plasma, radio frequency plasma, and microwave plasma.

The above-described first to fourth embodiments are directed to the p-type GaN semiconductor layer not including indium (In) which is used as a contact layer with an electrode. As the following fifth to ninth embodiments, a GaN system semiconductor layer including indium {$In_xGa_yAl_zB_{1-x-y-z}N_mP_nAs_{1-m-n}$ ($0<x$, $0\leq y$, $0\leq z$, $0<x+y+z\leq 1$, $0<m$, $0\leq n$, $0<m+n\leq 1$)} is used as a contact layer with an electrode. First the fifth and sixth embodiments regarding the principle of the nitride system semiconductor device will be described and then the seventh to ninth embodiments showing the concrete examples will be described. Since the temperature of the substrate and the flow rate of carrier gas are the same as those of the first to second embodiments, their detailed descriptions are omitted.

(Fifth Embodiment)

FIG. 19 is a cross-sectional view showing the principle of a nitride system semiconductor device according to the fifth embodiment of the present invention. This device includes an n-type GaN ($In_xGa_yAl_{1-x-y}N$, $x=0$, $y=1$) layer 62, a p-type Gan layer 63, and a p-type InGaN ($In_xGa_yAl_{1-x-y}N$, $0<x<1$, $0<y<1$, $x+y=1$) layer 64 which are formed in sequence on a sapphire substrate 61. The p-type GaN layer 63 and n-type GaN layer 62 constitute a pn junction.

(Distribution of Impurity Concentrations in Depth Direction)

Figure 20A:
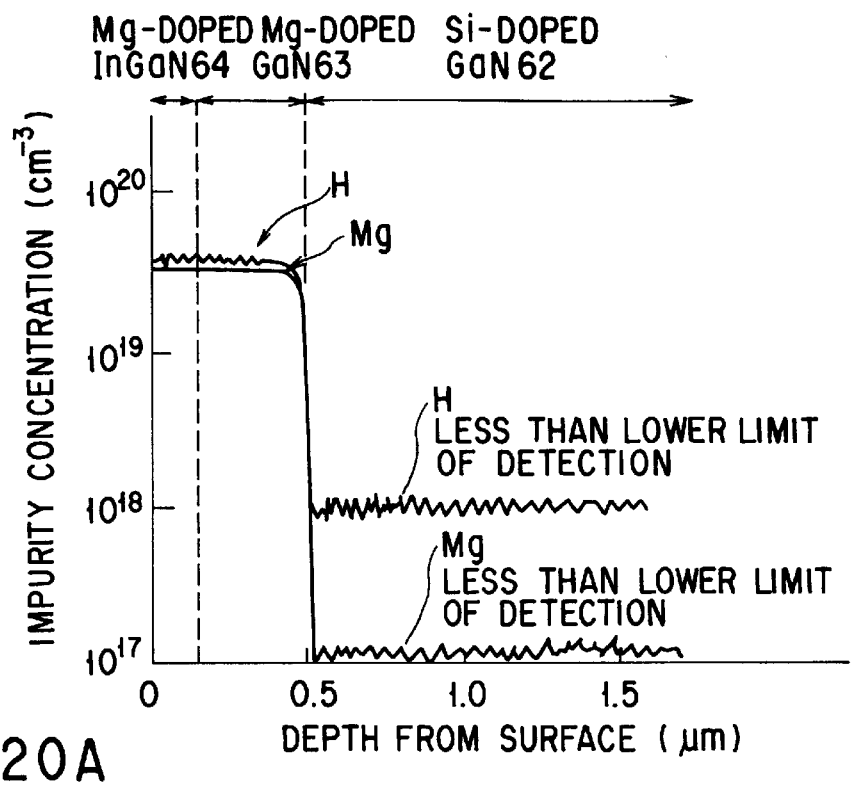
FIG. 20A is a graph showing the distribution of impurity concentrations in the depth direction of the growing layer in the fifth embodiment.

As for the structure illustrated in FIG. 19, the distribution of concentrations of each of magnesium (Mg) and hydrogen (H) in the depth direction of the growing layer was examined by the SIMS, as shown in FIG. 20A. For comparison, as shown in FIG. 20B, the same impurity concentration distribution was examined for the prior art structure corresponding to that of the present invention from which the p-type InGaN layer 64 was deleted.

Figure 20B:
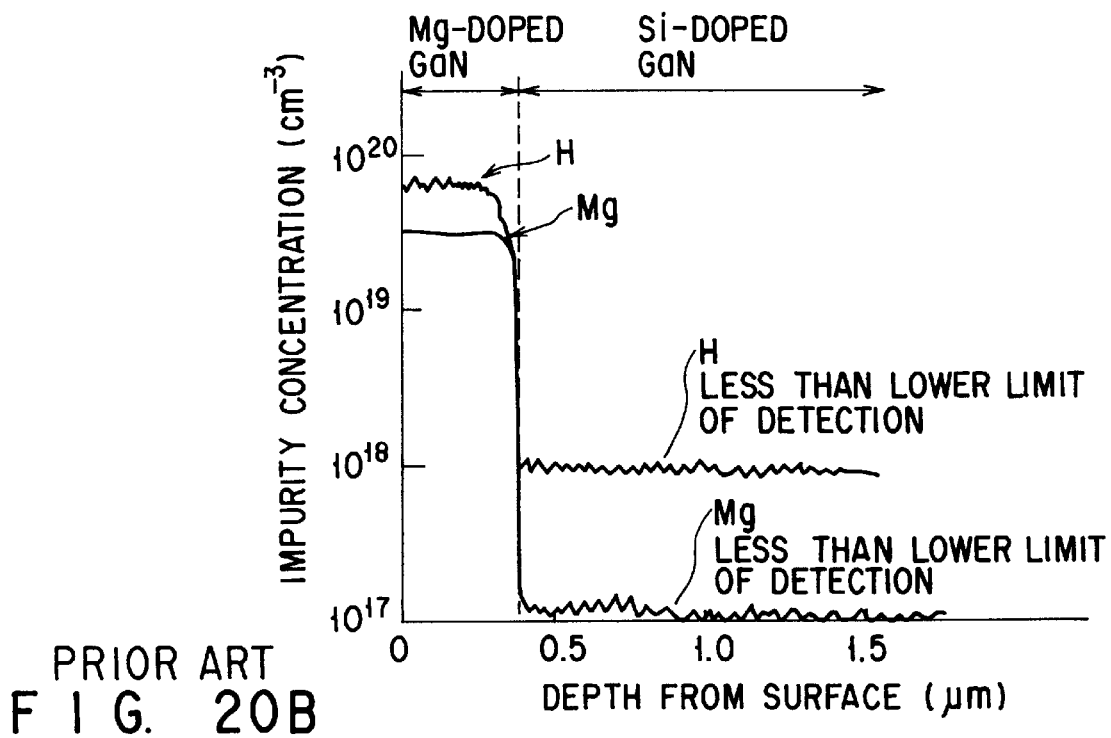
FIG. 20B is a graph showing the distribution of impurity concentrations in the depth direction of the growing layer in the prior art structure.

As is apparent from FIGS. 20A and 20B, when the Mg concentration of both the p-type GaN layer 63 and p-type InGaN layer 64 is $5\times10^{19}$ $cm^{-3}$, the hydrogen concentration of the p-type GaN layer of the prior art structure is $8\times10^{19}$ $cm^{-3}$, while that of the p-type InGaN layer 64 and p-type GaN layer 63 is $6\times10^{19}$ $cm^{-3}$. The latter value is substantially the same as the hydrogen concentration after the prior art p-type GaN layer grows and then undergoes heat treatment in nitrogen for 30 minutes at a temperature of 750° C.

Though not shown, the oxygen concentration and the carbon concentration of the p-type InGaN layer 64 in close vicinity to the surface thereof are $5\times10^{18}$ $cm^{-3}$ or lower and $5\times10^{19}$ $cm^{-3}$ or lower. Each of these concentrations is substantially uniform within the range of 3 to $10\times10^{17}$ $cm^{-3}$ from the depth of 100 nm or more from the uppermost surface toward the substrate. In other words, the resistance inside the device as well as that near the surface thereof is considerably low. In the conventional p-type GaN layer, both the oxygen and carbon concentrations near the surface are each higher than that in the present invention by one figure or more.

(C-V Measurement)

FIG. 21 is a table showing the results obtained by measuring the acceptor concentrations of samples for the SIMS using the C-V technique. Since the p-type InGaN layer 64 of the present invention grows in the nitrogen rich atmosphere, it functions as a low-resistance p-type layer, and then the p-type GaN layer 63 serves as a low-resistance p-type layer, as shown, and its resistance is $5.4\times10^{18}$ $cm^{-3}$ is substantially equal to a value obtained after the prior art p-type GaN layer grows and then undergoes heat treatment in the nitrogen atmosphere. In other words, it is thought that since the p-type InGaN layer 64 serving as a semiconductor layer containing indium (In) is formed above, hydrogen is prevented from being supplied into the p-type GaN layer 63 formed below, and the activation of magnesium is promoted.

(Modified Structure)

In the structure shown in FIG. 19, an n-type InGaN ($In_xGa_yAl_{1-x-y}N$, $0<x<1$, $0<y<1$, $x+y=1$) layer 65 can be formed on the top surface in place of the p-type InGaN layer 64, as illustrated in FIG. 22.

Furthermore, a p-type InGaN layer whose indium (In) ingredient ratio is lower than that of the p-type InGaN layer 64, can be interposed between the p-type GaN layer 63 and p-type InGaN layer 64 to facilitate lattice matching.

As shown in FIG. 23, a pin junction can be formed by the n-type GaN layer 62 and p-type GaN layer 63 with an undoped i-type InGaN layer 66 interposed therebetween. The present invention can be applied to either of pn and pin junctions.

As illustrated in FIG. 24, a GaN buffer layer 71 and an undoped or n⁻-type GaN layer 72 can be formed between the sapphire substrate 61 and n-type GaN layer 62 in order to improve in surface morphology. Furthermore, a pin junction can be formed by the undoped I-type InGaN layer 66, an n-type GaAlN layer 73 formed as a lower layer of the layer 66, and a p-type GaAlN layer 74 formed as an upper layer of the layer 66.

(Sixth Embodiment)

FIG. 25 is a cross-sectional view showing the principle of a nitride system semiconductor device according to the sixth embodiment of the present invention. This device has a current blocking structure in which an undoped GaN underlayer 82, an n-type GaN contact layer 83, an undoped InGaN active layer 84, and a p-type GaN current injection layer 85 are formed in sequence on a sapphire substrate 81.

A plurality of n-type GaN current blocking layers 86 are selectively formed on the p-type GaN current injection layer 85. A p-type InGaN contact layer 87 is formed on the p-type GaN current injection layer 85 and n-type GaN current blocking layer 86.

A method for manufacturing the foregoing nitride system semiconductor device having a current blocking structure, and a function thereof will now be described.

Figure 26A:
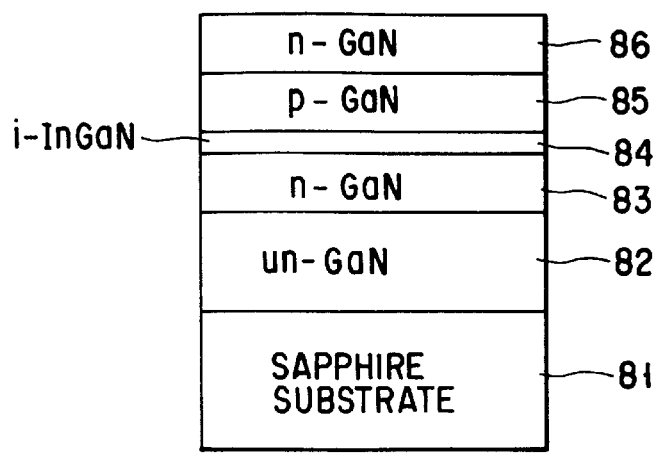
FIGS. 26A to 26C are views showing a process of manufacturing the nitride system semiconductor device of the sixth embodiment.
Figure 26B:
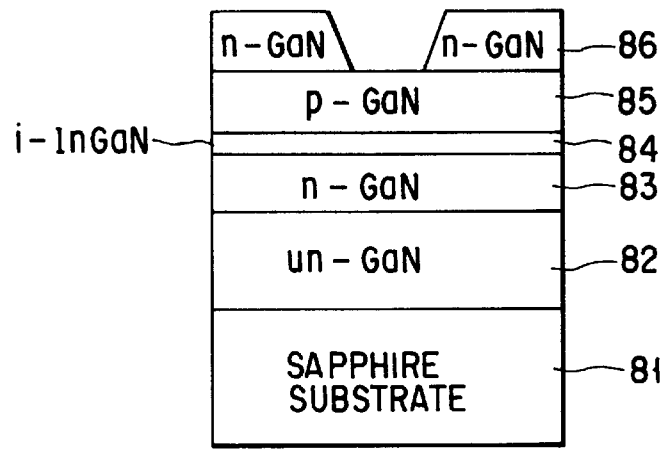
Figure 26C:
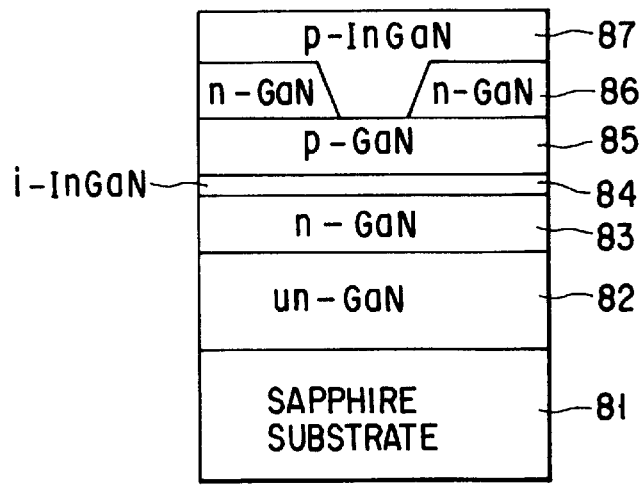

In the nitride system semiconductor device, as shown in FIG. 26A, an undoped GaN layer 82, an n-type GaN layer 83, an undoped GaN active layer 84, a p-type GaN current injection layer 85, and an n-type GaN current blocking layer 86 are formed in sequence on a sapphire substrate 81 in the same chamber by the first MOCVD. After that, as shown in FIG. 26B, part of the n-type GaN current blocking layer 86 is removed by etching and then a p-type InGaN contact layer 87 is formed by the second MOCVD (regrowth).

Magnesium (Mg) or zinc (Zn) is used as a p-type dopant.

According to the above manufacturing method, the p-type InGaN contact layer 87 formed by the second MOCVD has the same low oxygen concentration and low carbon concentration as described above and its resistance is decreased without any heat treatment.

Part of the p-type GaN current injection layer 85 formed by the first MOCVD, which corresponds to the removed portion of the n-type GaN current blocking layer 86 or which is exposed in the chamber at the time of the second MOCVD, is a p-type low-resistance layer. According to the C-V measurement, the acceptor concentration thereof is $3 \times 10^{18}$ cm⁻³. (According to the SIMS analysis, the magnesium concentration thereof is $2 \times 10^{19}$ cm⁻³.

Another part of the p-type GaN current injection layer 85, which is covered with the n-type GaN current blocking layer 86, is not decreased in resistance during the regrowth.

According to the sixth embodiment as described above, since the p-type InGaN contact layer 87 is formed by the second MOCVD (regrowth), heat treatment is not required, a low-resistance p-type layer can be formed, and the current blocking can be promoted further.

(Modified Structure)

Figure 27:
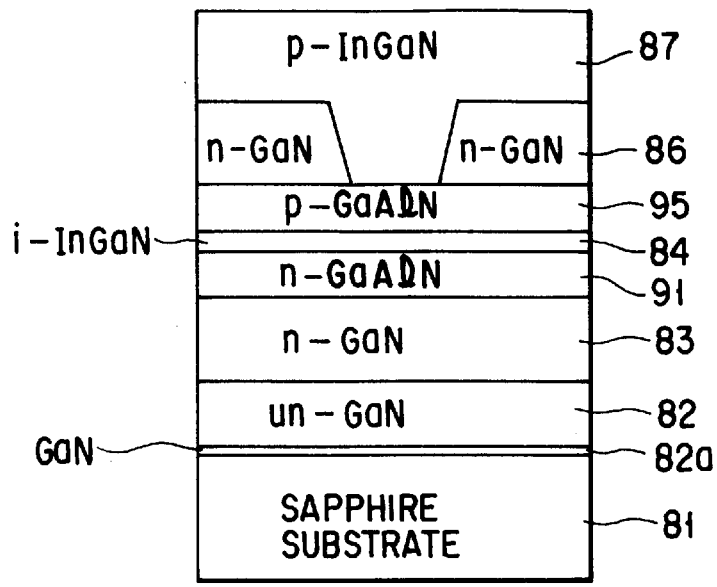
FIG. 27 is a view of a modified structure of the sixth embodiment.

In the structure according to the sixth embodiment, as shown in FIG. 27, a GaN buffer layer 82a can be provided between the sapphire substrate 81 and undoped GaN underlayer 82. Furthermore, as shown in FIG. 27, an n-type GaAlN current injection layer 91 can be interposed between the undoped InGaN active layer 84 and n-type GaN contact layer 83, and a p-type GaAlN current injection layer 95 can be formed in place of the p-type GaN current injection layer 85. A desired one of the n-type GaN current blocking layer 86 and n-type InGaN current blocking layer can be formed on either of the layers 85 and 95.

(Seventh Embodiment)

Figure 28:
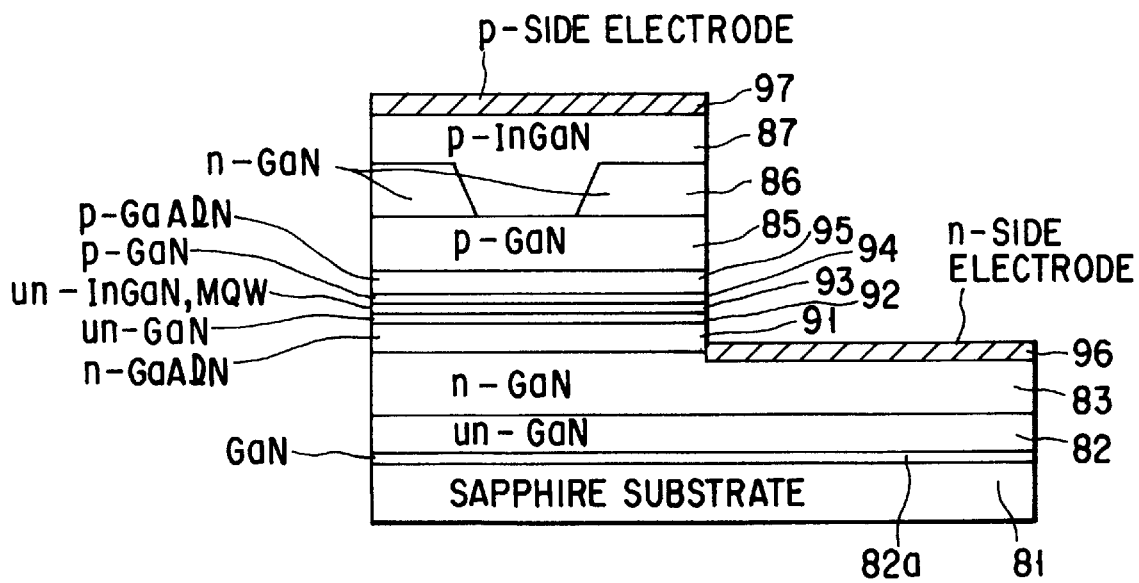
FIG. 28 is a cross-sectional view of the structure of a semiconductor laser according to a seventh embodiment of the present invention.

FIG. 28 is a cross-sectional view of the structure of a semiconductor laser according to a seventh embodiment of the present invention. In FIG. 28, the same constituting elements as those of FIGS. 26A to 26C and 27 are denoted by the same reference numerals. In this semiconductor laser, a GaN buffer layer 82a, an undoped GaN underlayer 82, an n-type GaN contact layer 83, an n-type GaAlN current injection layer 91, an undoped GaN guide layer 92, an undoped GaAlN active layer 93 of the MQW structure, a p-type GaN guide layer 94, a p-type GaAlN current injection layer 95, and a p-type GaN current injection layer 85 are formed in sequence on a sapphire substrate 81.

An n-type GaN current blocking layer 86 is selectively formed on the p-type GaN current injection layer 85. A p-type InGaN contact layer 87 is formed on the p-type GaN current injection layer 85 and n-type GaN current blocking layer 86.

A p-side electrode 97 is formed on the p-type InGaN contact layer 87. An n-side electrode 96 is formed on the n-type GaN contact layer 83 part of which is exposed by etching or the like.

A method for manufacturing the above semiconductor laser and a function thereof will now be described.

Figure 29A:
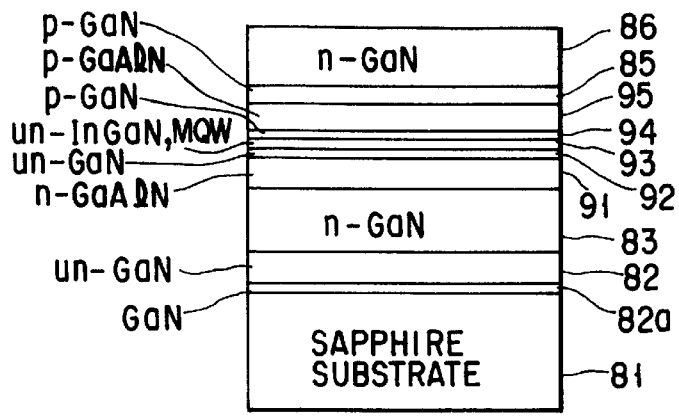
FIGS. 29A to 29C are views showing a process of manufacturing the nitride system semiconductor device of the seventh embodiment.

As illustrated in FIG. 29A, a 50-nm-thick undoped GaN ($In_xGa_yAl_{1-x-y}N$, x=0, y=1) buffer layer 82a, a 2-μm-thick undoped GaN underlayer 82, a 4-μm-thick n-type GaN contact layer 83, a 0.3-μm-thick n-type $Ga_qAl_{1-q}N$ ($0 \leq q \leq 1$) current injection layer 91, a 0.1-μm-thick undoped GaN guide layer 92, an undoped InGaN active layer 93 having of the MQW structure of 0.1 μm in thickness, a 0.1-μm-thick p-type GaN guide layer 94, a 0.3-μm-thick p-type $Ga_qAl_{1-q}N$ ($0 \leq q \leq 1$) current injection layer 95, a 0.5-μm-thick p-type GaN current injection layer 85, and a 1-μm-thick n-type GaN ($Ga_qAl_{1-q}N$, q=1) current blocking layer 86 are formed continuously on a sapphire substrate 81 by MOCVD.

The density of n-type impurities is controlled appropriately by introducing monosilane ($SiH_4$). Similarly, the density of p-type impurities is controlled appropriately by introducing biscyclopentadienylmagnesium ($Cp_2Mg$).

Figure 29B:
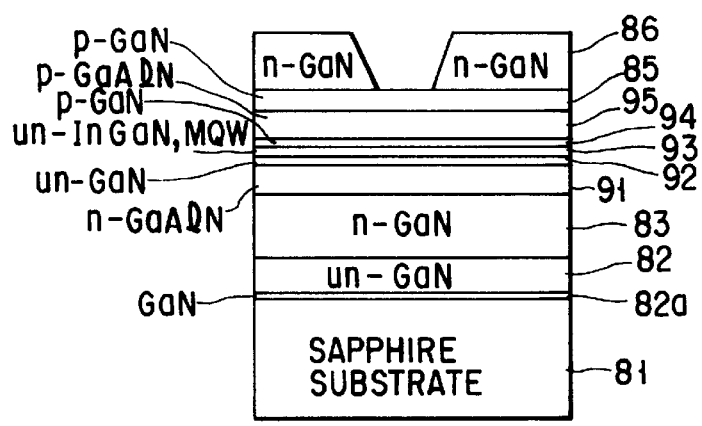

Referring to FIG. 29B, the n-type GaN current blocking layer 86 is patterned and part thereof is removed by etching or the like to expose the p-type GaN current injection layer 85 from the uppermost surface.

Figure 29C:
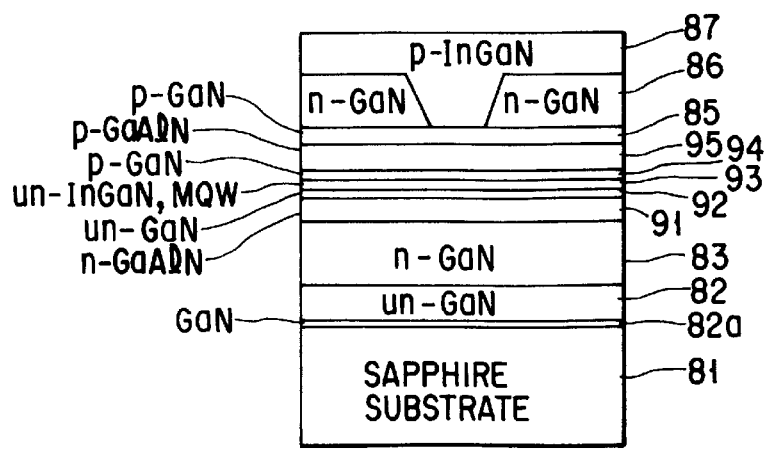

As shown in FIG. 29C, a p-type InGaN ($In_xGa_yAl_{1-x-y}N$, $0<x \leq 0.3$, $0.7 \leq y<1$, x+y=1) contact layer 87 having a thickness of 1.5 μm is formed on the layers 85 and 86 by the MOCVD. The growth temperature ranges from 750° C. to 1100° C., and hydrogen is used as the carrier gas of the material gas while nitrogen gas is employed as the main carrier gas.

Figure 30A:
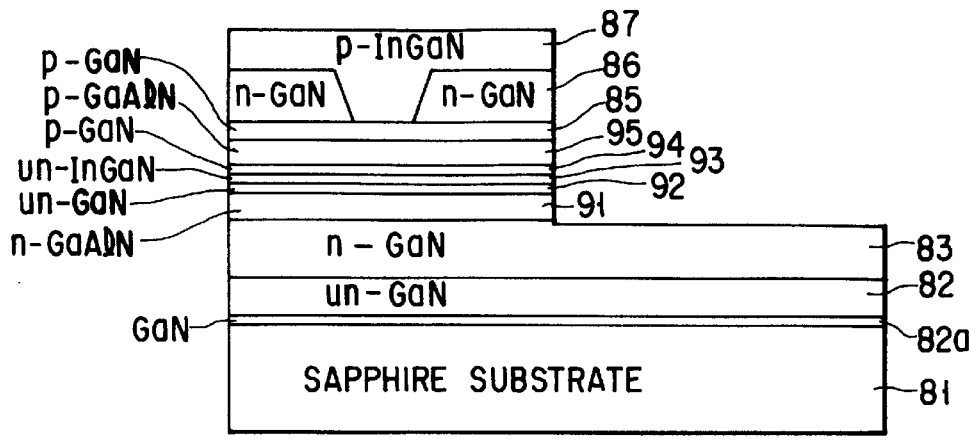
FIGS. 30A to 30C are views showing a process of manufacturing the nitride system semiconductor device of the seventh embodiment.

The wafer so obtained is removed from the MOCVD furnace and partly masked with $SiO_2$ or the like. The wafer is then etched to such a depth as to reach the n-type GaN contact layer 83, as shown in FIG. 30A.

The sapphire substrate 81 is formed so as to have a thickness of about 100 μm by polishing the reverse surface of the GaN system semiconductor layers 82a to 95 are deposited.

Figure 30B:
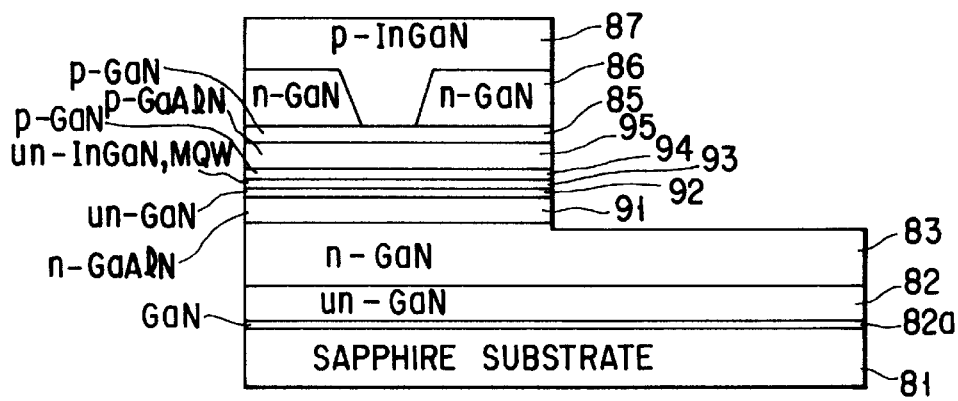
Figure 30C:
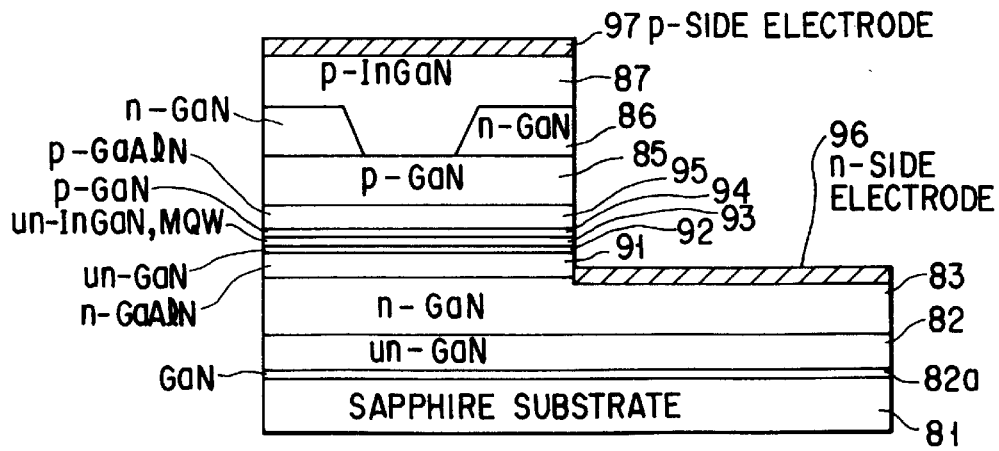

In FIG. 30B, an n-side electrode 96 of metal such as Ti-Au is formed on the n-type GaN contact layer 83. After that, SiO$_2$ of the mask is removed and, as shown in FIG. 30C, a p-side electrode 97 of Pt, Ti/Au, Ni, etc. is formed on the p-type InGaN contact layer 87.

The p-type InGaN contact layer 87 has a surface oxygen concentration of $5\times10^{18}$ cm$^{-3}$ or lower and a surface carbon concentration of $5\times10^{19}$ cm$^{-3}$ or lower. The layer 87 also has good, low-resistance ohmic contact.

The wafer so produced is cut to size by scribing, cleaving, dry etching or the like into a number of chips. If these chips are mounted on a predetermined stem (wire frame) and molded after wire bonding, the GaN system laser of the present invention is completed.

This semiconductor laser has good characteristics capable of emitting a laser beam with a wavelength of 400 nm at a low threshold voltage.

The process in the present invention as described above can be made simpler than that in the prior art. More specifically, according to the present invention, the inactivation of acceptors, which is due to hydrogen introduced into the p-type clad layer and p-type contact layer, can be suppressed only by adding a simple step of growing the p-type InGaN semiconductor layer to the prior art continuous epitaxial growing step.

Since, therefore, heat treatment is unnecessary, the number of manufacturing steps is decreased and, moreover, the factor in decreasing in device characteristics by the contamination of the surface, the diffusion of impurities in crystal in the heat treatment step after the growth, etc., can be eliminated.

Since, furthermore, the surface oxygen and carbon concentrations can be lowered, good, low-resistance ohmic contact can be achieved and an operation voltage can be decreased, thus achieving a good-characteristic semiconductor laser which emits a laser beam with a wavelength of 400 nm at a low threshold current (low operation voltage).

The kind of p-type dopant (e.g., Mg), the thickness of p-type InGaN contact layer 87 (50 nm to 1500 nm), ingredient ratio x of indium (0<x≦0.3), the kind of carrier gas (material gas containing hydrogen gas and ammonia, carrier gas of nitrogen gas), the flow rate (nitrogen gas : oxygen gas=5 to 2000:1) and the like fall within an appropriate range. The above-described advantages can thus be easily and reliably obtained, and the stability of device characteristics and manufacturing process can be improved.

(Modified Structure)

In the seventh embodiment of the present invention, as illustrated in FIG. 31, the p-type GaN current injection layer 85 formed by the first MOCVD, can be omitted. In this case, the layer formed by the second MOCVD may have a two-layer structure of the p-type GaN layer 85a and p-type InGaN contact layer 87, as shown in FIG. 32.

(Eighth Embodiment)

A semiconductor laser according to an eighth embodiment of the present invention will now be described.

FIG. 33 is a cross-sectional view showing the principle of the semiconductor laser. In this figure, the same constituting elements as those of FIG. 25 are indicated by the same reference numerals. The semiconductor laser has a SBR structure. An undoped GaN underlayer 82, an n-type GaN contact layer 83, an undoped InGaN active layer 84, and a p-type GaN current injection layer 85 are formed in order on a sapphire substrate 81.

A ridge is formed on the p-type GaN current injection layer 85 by selective etching. A plurality of n-type InGaN light confined layers 98 are selectively formed on the layer 85 except where the ridge is formed. A p-type InGaN contact layer 87 is formed on the ridge of the layer 85 and the layer 98.

A method of manufacturing the semiconductor laser having the SBR structure and a function thereof will be described.

In this semiconductor laser, as illustrated in FIG. 34A, an undoped GaN underlayer 82, an n-type GaN contact layer 83, an undoped InGaN active layer 84, and a p-type GaN current injection layer 85 are formed in order on a sapphire substrate 81 in the same chamber by the first MOCVD. After that, as shown in FIG. 34B, the p-type GaN layer 85 is partly removed by etching to form a ridge. Referring to FIG. 34C, a mask 99 of, e.g., SiO$_2$ is formed on the ridge. Then, the n-type InGaN layer 98 is grown again (by the second MOCVD) and selectively formed on the p-type GaN layer 85 except where the mask 99 is formed. After that, the mask 99 is removed and, as shown in FIG. 34D, the p-type InGaN layer 87 is formed on the ridge of the layer 85 and the n-type InGaN layer 98 by the third MOCVD.

Even in the foregoing SBR structure, the p-type InGaN contact layer 87 has low oxygen and carbon concentrations and good, low-resistance ohmic contact is obtained as in the current blocking structure, good characteristics capable of emitting a laser beam with a wavelength of 400 nm at a low threshold current.

(Modified structure)

Figure 35:
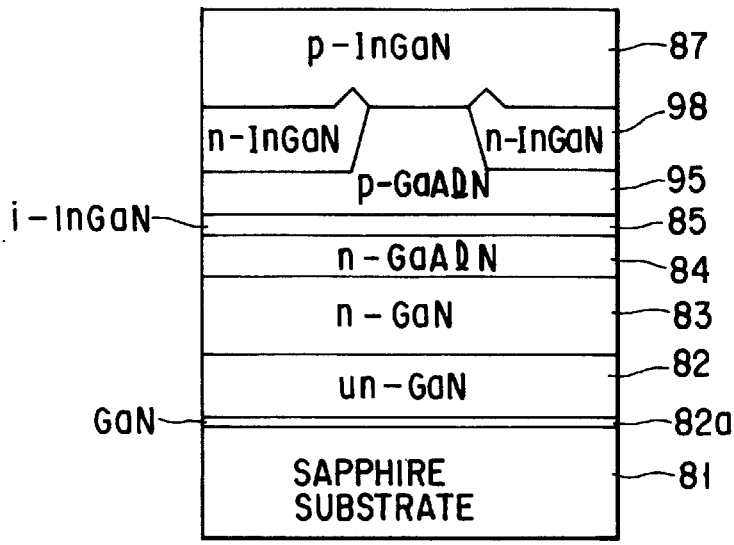
FIG. 35 is a view of a modified structure of the eighth embodiment.

In the eighth embodiment, as shown in FIG. 35, a GaN buffer layer 82a can be provided between the sapphire substrate 81 and undoped GaN underlayer 82. Furthermore, an n-type GaAlN current injection layer 91 can be interposed between the undoped InGaN active layer 84 and n-type GaN contact layer 83, and a p-type GaAlN current injection layer 95 can be formed in place of the p-type GaN current injection layer 85.

When the p-type GaAlN current injection layer 95 is formed, the n-type InGaN light blocking layer 98 can be replaced with an n-type GaN light confined layer and, in other words, the ingredient ratio x of indium (In) can be zero in the n-type In$_x$Ga$_{1-x}$N (0≦x≦1) light blocking layer 98. It is needless to say that the n-type InGaN light blocking layer 98 can be used in place of the p-type GaAlN current injection layer 95.

(Ninth Embodiment)

Figure 36:
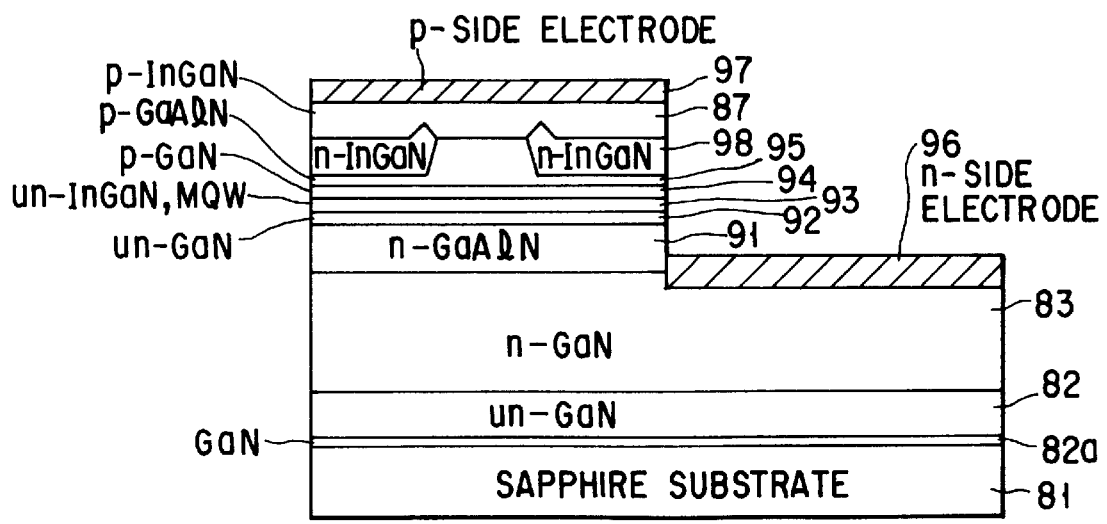
FIG. 36 is a cross-sectional view showing the structure of a semiconductor laser according to a ninth embodiment of the present invention.

FIG. 36 is a cross-sectional view illustrating the structure of a semiconductor laser according to a ninth embodiment of the present invention. In this figure, the same constituting elements as those of FIGS. 34A to 34D and 35 are denoted by the same reference numerals. In this semiconductor laser, a GaN buffer layer 82a, an undoped GaN underlayer 82, an n-type GaN contact layer 83, an n-type GaAlN current injection layer 91, an undoped GaN guide layer 92, an undoped InGaN active layer 93 of the MQW structure, a p-type GaN guide layer 94 and a p-type GaAlN current injection layer 95 are formed in sequence on a sapphire substrate 81.

A ridge is formed on the p-type GaAlN current injection layer 95 by selective etching. A plurality of n-type InGaN light confined layers 98 are selectively formed on the layer 95 except where the ridge is formed. A p-type InGaN contact layer 87 is formed on the ridge of the layer 95 and the layer 98.

A p-side electrode 97 is formed on the p-type InGaN contact layer 87, while an n-side electrode 96 is formed on the n-type GaN contact layer 83 part of which is exposed by etching or the like.

A method of manufacturing the above semiconductor laser and a function thereof will now be described.

Figure 37A:
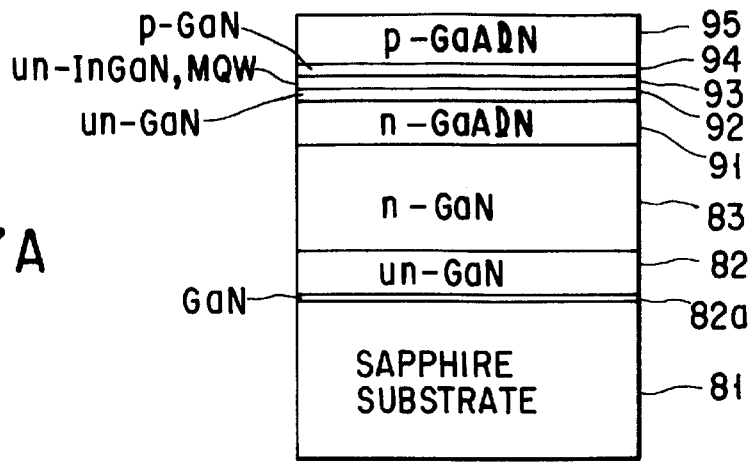
FIGS. 37A to 37C are views showing a process of manufacturing the semiconductor laser of the ninth embodiment.

Referring to FIG. 37A, as described above, a 50-nm-thick undoped GaN ($In_xGa_yAl_{1-x-y}N$, x=0, y=1) buffer layer 82a, a 2-μm-thick undoped GaN underlayer 82, a 4-μm-thick n-type GaN contact layer 83, a 0.3-μm-thick n-type $Ga_qAl_{1-q}N$ (0≦q≦1) current injection layer 91, a 0.1-μm-thick undoped GaN guide layer 92, an undoped InGaN active layer 93 having of the MQW structure of 0.1 μm in thickness, a 0.1-μm-thick p-type GaN guide layer 94, and a 0.3-μm-thick p-type $Ga_qAl_{1-q}N$ (0≦q≦1) current injection layer 95 are formed continuously on a sapphire substrate 81 by the MOCVD.

Figure 37B:
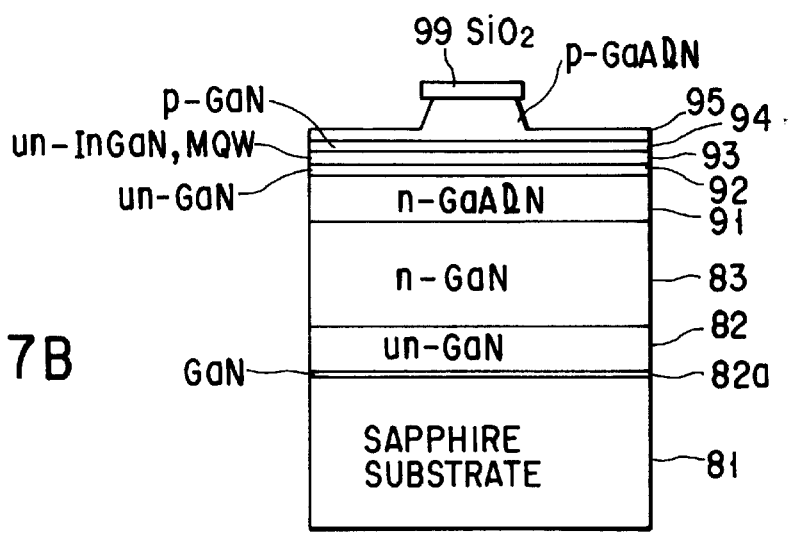

As illustrated in FIG. 37B, an $SiO_2$ layer 99 is formed on the p-type $Ga_qAl_{1-q}N$ (0≦q≦1) current injection layer 95 by patterning and masking and selectively removed by etching or the like to form a ridge.

Figure 37C:
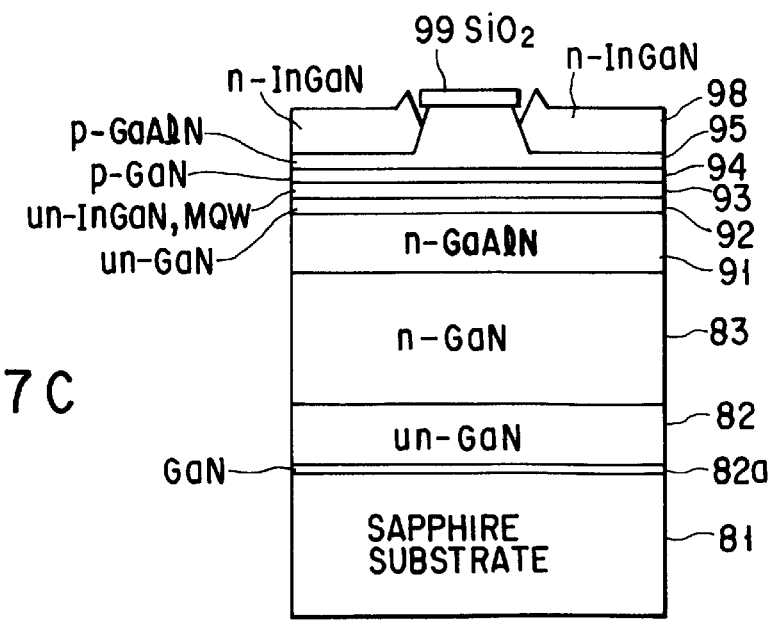

After that, as illustrated in FIG. 37C, an n-type $In_xGa_{1-x}N$ (0≦x≦1) light blocking layer 98 is selectively grown again and formed on the layer 95 except where the ridge is formed.

The mask of $SiO_2$ layer 99 is removed from the ridge of the p-type layer 95. As shown in FIG. 38A, using the MOCVD, a 1-μm-thick p-type InGaN ($In_xGa_yAl_{1-x-y}N$, 0<x≦0.3, 0.7 ≦y <1, x+y=1) layer 87 is formed on the ridge of the layer 95 and the n-type InGaN light blocking layer 98. Then, the growth temperature ranges from 750° C. to 1000° C., and hydrogen is used as the carrier gas of the material gas while nitrogen gas is employed as the main carrier gas.

As described above, the wafer so obtained is selectively etched to such a depth as to reach the n-type GaN contact layer 83 and then the sapphire substrate 81 is formed to have a thickness of about 100 μm by polishing, as shown in FIG. 38B.

Similarly, as illustrated in FIG. 38C, an n-side electrode 96 is formed on the n-type GaN contact layer 83, and a p-side electrode 97 is formed on the p-type InGaN contact layer 87. These electrodes 96 and 97 can be constituted of the same material as described above.

The finished wafer with electrodes is cut into a number of chips by the cleavage and the like as in the above embodiment. Each of the chips is mounted on a predetermined stem (wire frame) for wire bonding and molding and then processed as a GaN system laser of the finished product.

According to the semiconductor laser of a ninth embodiment, the p-type InGaN contact layer 87 has low oxygen and carbon concentrations, and good, low-resistance ohmic contact is formed, thus obtaining good characteristics capable of emitting a laser beam with a wavelength of 400 nm at a low threshold current.

According to the ninth embodiment, in addition to the advantage of the seventh embodiment, since the ridge and the other portion of the p-type layer 95 are properly defined, and the composition x is so determined that the bandgap energy of the n-type layer 98 is smaller than that of the active layer 93, a semiconductor laser having a SBR structure as well as a IS structure.

(Other Embodiments)

The present invention employs the technique of optimizing a combination of carrier gas and dopant in the manufacturing process, promoting the activation of dopant without heat treatment, and optimizing both the oxygen and carbon concentrations on the uppermost surface of the growing layer thereby to reduce in contact resistance. Thus, the present invention is not limited to the IS structure or SBR structure of the double-heterostructure (DH) but involves a homojunction structure and a single-heterostructure (SH) other than the double-heterostructure. It is needless to say that the present invention envolves the structures other than the IS structure or SBR structure even though they are double-heterostructures.

The present invention can be applied to an electronic device such as a p-channel HEMT and an HBT as well as a light emitting device such as an LED and an LD using a nitride system semiconductor.

The same advantage as that of the present invention can be obtained even though an inactive gas, such as argon (Ar) and helium (He), is used as the main carrier gas in addition to nitrogen.

According to the above description, a carrier gas which is substantially formed of inactive gas such as nitrogen gas is used at the time of p-type layer growth. However, it is possible to use a nitrogen carrier gas at the time of n-type layer growth for manufacturing nitrogen system semiconductor devices, like LED and LD. In other words, all layers can be formed using the inactive gas like nitrogen gas e.g. as main carrier gas at the time of multi-layer growth for devises.

The present invention provides a nitride system semiconductor device capable of achieving good characteristics without heat treatment after the growth. However, heat treatment can be carried out after the growth in order to further improve in characteristics and, in other words, heat treatment after the growth is not inhibited but can be omitted in the present invention.

Various changes and modifications can be made without departing from the scope of the subject mater of the present invention.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A nitride system semiconductor device, comprising:

a substrate;

a plurality of nitride system semiconductor layers stacked up on said substrate;

a p-type $In_xGa_yAl_zB_{1-x-y-z}N_mP_nAs_{1-m-n}$ (0≦x, 0≦y, 0≦z, 0≦x+y+z≦1, 0<m, 0≦n, 0<m+n≦1) layer included in said plurality of nitride system semiconductor layers and formed as an uppermost layer;

a p-side electrode formed on one surface of said p-type $In_xGa_yAl_zB_{1-x-y-z}N_mP_nAs_{1-m-n}$ layer;

an n-type $In_xGa_yAl_zB_{1-x-y-z}N_mP_nAs_{1-m-n}$ (0≦x, 0≦y, 0≦z, 0≦x+y+z≦1, 0<m, 0≦n, 0<m+n≦1) layer included in said plurality of nitride system semiconductor layers and formed closer to said substrate than said p-type $In_xGa_yAl_zB_{1-x-y-z}N_mP_nAs_{1-m-n}$ layer; and an n-side electrode provided on at least one of said substrate and one of said plurality of nitride system semiconductor layers so as to form a current path extending from said p-side electrode through said p-type $In_xGa_yAl_zB_{1-x-y-z}N_mP_nAs_{1-m-n}$ layer and said n-type $In_xGa_yAl_zB_{1-x-y-z}N_mP_nAs_{1-m-n}$ layer, wherein a concentration of oxygen in close vicinity to a surface of said p-type $In_xGa_yAl_zB_{1-x-y-z}N_mP_nAs_{1-m-n}$ layer is $5 \times 10^{18}$ $cm^{-3}$ or lower.

2. The nitride system semiconductor device according to claim 1, wherein said concentration of oxygen is substantially uniform with $1 \times 10^{18}$ $cm^{-3}$ or less from a depth of 200 nm or more from the uppermost layer toward said substrate.

3. The nitride system semiconductor device according to claim 1, further comprising:

an active layer constituted of a nitride system semiconductor and formed in contact with another surface of said p-type in $In_xGa_yAl_zB_{1-x-y-z}N_mP_nAs_{1-m-n}$ layer which is opposite to the one surface on which said p-side electrode is formed;

an n-type semiconductor layer of a nitride system, formed in contact with one surface of said active layer which is opposite to another surface on which said p-type $In_xGa_yAl_zB_{1-x-y-z}N_mP_nAs_{1-m-n}$ layer; and a double hetero structure including said p-type $In_xGa_yAl_zB_{1-x-y-z}N_mP_nAs_{1-m-n}$ layer, said active layer, and said n-type semiconductor layer;

wherein said p-type $In_xGa_yAl_zB_{1-x-y-z}N_mP_nAs_{1-m-n}$ layer includes at least two layers, and an uppermost layer of said two layers is a p-type $In_xGa_yAl_zB_{1-x-y-z}N_mP_nAs_{1-m-n}$ ($0<x\leq 0.3$, $0\leq y$, $0\leq z$, $0<x+y+z\leq 1$, $0<m$, $0\leq n$, $0<m+n\leq 1$) layer.

4. The nitride system semiconductor device according to claim 3, further comprising a p-type $In_sGa_qAl_rB_{1-s-q-r}N_mP_nAs_{1-m-n}$ ($0\leq s<0.3$, $s<x$, $0\leq q$, $0\leq r$, $0\leq s+q+r\leq 1$, $0<m$, $0\leq n$, $0<m+n\leq 1$) layer formed between said p-type $In_xGa_yAl_zB_{1-x-y-z}N_mP_nAs_{1-m-n}$ layer as the uppermost layer and said p-type $In_xGa_yAl_zB_{1-x-y-z}N_mP_nAs_{1-m-n}$ layer of said active layer side.

5. The nitride system semiconductor device according to claim 3, wherein said p-type $In_xGa_yAl_zB_{1-x-y-z}N_mP_nAs_{1-m-n}$ ($0<x\leq 0.3$, $0\leq y$, $0\leq x$, $0<x+y+z\leq 1$, $0<m$, $0\leq n$, $0<m+n\leq 1$) layer has a thickness ranging from 50 nm to 1500 nm.

6. The nitride system semiconductor device according to claim 1, wherein said p-type $In_xGa_yAl_zB_{1-x-y-z}N_mP_nAs_{1-m-n}$ layer includes at least two layers, and an uppermost layer of said two layers is a p-type $In_xGa_yAl_zB_{1-x-y-z}N_mP_nAs_{1-m-n}$ ($0<x\leq 0.3$, $0\leq y$, $0\leq z$, $0<x+y+z\leq 1$, $0<m$, $0\leq n$, $0<m+n\leq 1$) layer, and each of said two layers contains one of magnesium and zinc.

7. The nitride system semiconductor device according to claim 6, further comprising a p-type $In_sGa_qAl_rB_{1-s-q-r}N_mP_nAs_{1-m-n}$ ($0\leq s<0.3$, $s<x$, $0\leq q$, $0\leq r$, $0\leq s+q+r\leq 1$, $0<m$, $0\leq n$, $0<m+n\leq 1$) layer formed between said p-type $In_xGa_yAl_zB_{1-x-y-z}N_mP_nAs_{1-m-n}$ layer as the uppermost layer and said p-type $In_xGa_yAl_zB_{1-x-y-z}N_mP_nAs_{1-m-n}$ layer of said n-type layer side.

8. A nitride system semiconductor device, comprising:

a substrate;

a plurality of nitride system semiconductor layers stacked up on said substrate;

a p-type $In_xGa_yAl_zB_{1-x-y-z}N_mP_nAs_{1-m-n}$ ($0\leq x$, $0\leq y$, $0\leq z$, $0\leq x+y+z\leq 1$, $0<m$, $0\leq n$, $0<m+n\leq 1$) layer included in said plurality of nitride system semiconductor layers and formed as an uppermost layer;

a p-side electrode formed on one surface of said p-type $In_xGa_yAl_zB_{1-x-y-z}N_mP_nAs_{1-m-n}$ layer;

an n-type $In_xGa_yAl_zB_{1-x-y-z}N_mP_nAs_{1-m-n}$ ($0\leq x$, $0\leq y$, $0\leq z$, $0\leq x+y+z\leq 1$, $0<m$, $0\leq n$, $0<m+n\leq 1$) layer included in said plurality of nitride system semiconductor layers and formed closer to said substrate than said p-type $In_xGa_yAl_zB_{1-x-y-z}N_mP_nAs_{1-m-n}$ layer; and an n-side electrode provided on at least one of said substrate and one of said plurality of nitride system semiconductor layers so as to form a current path extending from said p-side electrode through said p-type $In_xGa_yAl_zB_{1-x-y-z}N_mP_nAs_{1-m-n}$ layer and said n-type $In_xGa_yAl_zB_{1-x-y-z}N_mP_nAs_{1-m-n}$ layer, wherein a concentration of oxygen in close vicinity to a surface of said p-type $In_xGa_yAl_zB_{1-x-y-z}N_mP_nAs_{1-m-n}$ layer has a maximum value which is 5 or less times an average value of a concentration of oxygen within the surface.

9. A nitride system semiconductor device, comprising:

a substrate;

a plurality of nitride system semiconductor layers stacked up on said substrate;

a p-type $In_xGa_yAl_zB_{1-x-y-z}N_mP_nAs_{1-m-n}$ ($0\leq x$, $0\leq y$, $0\leq z$, $0\leq x+y+z\leq 1$, $0<m$, $0\leq n$, $0<m+n\leq 1$) layer included in said plurality of nitride system semiconductor layers and formed as an uppermost layer;

a p-side electrode formed on one surface of said p-type $In_xGa_yAl_zB_{1-x-y-z}N_mP_nAs_{1-m-n}$ layer;

an n-type $In_xGa_yAl_zB_{1-x-y-z}N_mP_nAs_{1-m-n}$ ($0\leq x$, $0\leq y$, $0\leq z$, $0\leq x+y+z\leq 1$, $0<m$, $0\leq n$, $0<m+n\leq 1$) layer included in said plurality of nitride system semiconductor layers and formed closer to said substrate than said p-type $In_xGa_yAl_zB_{1-x-y-z}N_mP_nAs_{1-m-n}$ layer; and an n-side electrode provided on at least one of said substrate and one of said plurality of nitride system semiconductor layers so as to form a current path extending from said p-side electrode through said p-type $In_xGa_yAl_zB_{1-x-y-z}N_mP_nAs_{1-m-n}$ layer and said n-type $In_xGa_yAl_zB_{1-x-y-z}N_mP_nAs_{1-m-n}$ layer, wherein a concentration of carbon in close vicinity to a surface of said p-type $In_xGa_yAl_zB_{1-x-y-z}N_mP_nAs_{1-m-n}$ layer is $5\times 10^{19}$ cm$^{-3}$ or lower.

10. The nitride system semiconductor device according to claim 9, wherein said concentration of carbon is substantially uniform with $1\times 10^{18}$ cm$^{-3}$ or less from a depth of 200 nm or more from the uppermost layer toward said substrate.

11. The nitride system semiconductor device according to claim 9, further comprising:

an active layer constituted of a nitride system semiconductor and formed in contact with another surface of said p-type $In_xGa_yAl_zB_{1-x-y-z}N_mP_nAs_{1-m-n}$ layer which is opposite to the one surface on which said p-side electrode is formed;

an n-type semiconductor layer of a nitride system, formed in contact with one surface of said active layer which is opposite to another surface on which said p-type $In_xGa_yAl_zB_{1-x-y-z}N_mP_nAs_{1-m-n}$ layer; and a double hetero structure including said p-type $In_xGa_yAl_zB_{1-x-y-z}N_mP_nAs_{1-m-n}$ layer, said active layer, and said n-type semiconductor layer;

wherein said p-type $In_xGa_yAl_zB_{1-x-y-z}N_mP_nAs_{1-m-n}$ layer includes at least two layers, and an uppermost layer of said two layers is a p-type $In_xGa_yAl_zB_{1-x-y-z}N_mP_nAs_{1-m-n}$ ($0<x\leq 0.3$, $0\leq y$, $0\leq z$, $0<x+y+z\leq 1$, $0<m$, $0\leq n$, $0<m+n\leq 1$) layer.

12. The nitride system semiconductor device according to claim 11, further comprising a p-type $In_sGa_qAl_rB_{1-s-q-r}N_mP_nAs_{1-m-n}$ ($0\leq s<0.3$, $s<x$, $0\leq q$, $0\leq r$, $0\leq s+q+r\leq 1$, $0<m$, $0\leq n$, $0<m+n\leq 1$) layer formed between said p-type $In_xGa_yAl_zB_{1-x-y-z}N_mP_nAs_{1-m-n}$ layer as the uppermost layer and said p-type $In_xGa_yAl_zB_{1-x-y-z}N_mP_nAs_{1-m-n}$ layer of said active layer side.

13. The nitride system semiconductor device according to claim 11, wherein said p-type $In_xGa_yAl_zB_{1-x-y-z}N_mP_nAs_{1-m-n}$ ($0<x\leq 0.3$, $0\leq y$, $0\leq z$, $0<x+y+z\leq 1$, $0<m$, $0\leq n$, $0<m+n\leq 1$) layer has a thickness ranging from 50 nm to 1500 nm.

14. The nitride system semiconductor device according to claim 9, wherein said p-type $In_xGa_yAl_zB_{1-x-y-z}N_mP_nAs_{1-m-n}$ layer includes at least two layers, and an uppermost layer of said two layers is a p-type $In_xGa_yAl_zB_{1-x-y-z}N_mP_nAs_{1-m-n}$ $(0<x\leq0.3, 0\leq y, 0\leq z, 0<x+y+z\leq1, 0<m, 0\leq n, 0<m+n\leq1)$ layer, and each of said two layers contains one of magnesium and zinc.

15. The nitride system semiconductor device according to claim 14, further comprising a p-type $In_sGa_qAl_rB_{1-s-q-r}N_mP_nAs_{1-m-n}$ ($0\leq s<0.3$, $s<x$, $0\leq q$, $0\leq r$, $0\leq s+q+r\leq1$, $0<m$, $0\leq n$, $0<m+n\leq1$) layer formed between said p-type $In_xGa_yAl_zB_{1-x-y-z}N_mP_nAs_{1-m-n}$ layer as the uppermost layer and said p-type $In_xGa_yAl_zB_{1-x-y-z}N_mP_nAs_{1-m-n}$ layer of said n-type layer side.

16. A nitride system semiconductor device, comprising:

a substrate;

a plurality of nitride system semiconductor layers stacked up on said substrate;

a p-type $In_xGa_yAl_zB_{1-x-y-z}N_mP_nAs_{1-m-n}$ ($0\leq x$, $0\leq y$, $0\leq z$, $0\leq x+y+z\leq1$, $0<m$, $0\leq n$, $0<m+n\leq1$) layer included in said plurality of nitride system semiconductor layers and formed as an uppermost layer;

a p-side electrode formed on one surface of said p-type $In_xGa_yAl_zB_{1-x-y-z}N_mP_nAs_{1-m-n}$ layer;

an n-type $In_xGa_yAl_zB_{1-x-y-z}N_mP_nAs_{1-m-n}$ ($0\leq x$, $0\leq y$, $0\leq z$, $0\leq x+y+z\leq1$, $0<m$, $0\leq n$, $0<m+n\leq1$) layer included in said plurality of nitride system semiconductor layers and formed closer to said substrate than said p-type $In_xGa_yAl_zB_{1-x-y-z}N_mP_nAs_{1-m-n}$ layer; and an n-side electrode provided on at least one of said substrate and one of said plurality of nitride system semiconductor layers so as to form a current path extending from said p-side electrode through said p-type $In_xGa_yAl_zB_{1-x-y-z}N_mP_nAs_{1-m-n}$ layer and said n-type $In_xGa_yAl_zB_{1-x-y-z}N_mP_nAs_{1-m-n}$ layer, wherein a concentration of carbon in close vicinity to a surface of said p-type $In_xGa_yAl_zB_{1-x-y-z}N_mP_nAs_{1-m-n}$ layer has a maximum value which is 5 or less times an average value of a concentration of carbon within the surface.

* * * * *